United States Patent [19]

Jovanovic

[11] Patent Number: 5,736,842

[45] Date of Patent: Apr. 7, 1998

[54] TECHNIQUE FOR REDUCING RECTIFIER REVERSE-RECOVERY-RELATED LOSSES IN HIGH-VOLTAGE HIGH POWER CONVERTERS

[75] Inventor: Milan M. Jovanovic, Blacksburg, Va.

[73] Assignee: Delta Electronics, Inc., Taipei, Taiwan

[21] Appl. No.: 679,601

[22] Filed: Jul. 11, 1996

[51] Int. Cl.[6] .............................. G05F 1/56; H02M 3/335
[52] U.S. Cl. ............................ 323/222; 363/21; 363/25
[58] Field of Search ................................ 323/222, 282, 323/285, 286; 363/16, 20, 21, 24, 25, 97

[56] References Cited

U.S. PATENT DOCUMENTS

| 5,418,704 | 5/1995 | Hua et al. | 363/21 |
|---|---|---|---|
| 5,432,431 | 7/1995 | Vinciarelli et al. | 323/222 |
| 5,446,366 | 8/1995 | Bassett et al. | 323/222 |
| 5,477,131 | 12/1995 | Gegner | 323/222 |
| 5,486,752 | 1/1996 | Hua et al. | 323/222 |

OTHER PUBLICATIONS

"High Power Factor Preregulators for Off-Line Power Supplies", Lloyd H. Dixon, Jr., pp. 12-1 to 12-16. Unitrode Power Supply Design Seminar, SEM-700, 1990.

"Switched Snubber For High Frequency Switching", Koosuke Harada, etc., Dept. of Electronics, Kyushu University, Japan, IEEE, 1990, pp. 181-188.

"High Efficiency Telcom Rectifier Using a Novel Soft-Switched Boost-Based Input Current Shaper", Robert Streit, etc., Intelec, IEEE Nov. 1991, pp. 720-726.

"New Fast Recovery Diode Technology Cuts Circuit Losses, Improves Reliability", Y. Khersonsky, etc., Power Electronics/Motion, May 1992, pp. 16-25.

"Merits and Limitations of Resonant and Soft-Switched Converters", Milan M. Jovanovic, DELTA Power Electronics Lab., Inc., IEEE, 1992, pp. 51-58.

"Electromagnetic Compatibility (EMC)—Part 3: Limits—Section 2: Limits for harmonic current emissions . . . ", IEC, 1995, 30 pp.

"Novel Zero-Voltage-Transition PWM Converters", Guichao Hua, etc., IEEE, 1992, pp. 55-61.

"New, Zero Voltage Switching, High Frequency Boost Converter Topology for Power Factor Correction", John A. Bassett, IEEE, 1995, pp. 813-820.

"Basic Switch-Mode Power Conversion Concepts and Applications", Tutorial #2., Milan M. Jovanovic, Delta Power Electronics Lab, Inc., International Conference on Power Electronics, Oct. 10, 1995, pp. 1-154.

Primary Examiner—Adolf Berhane
Attorney, Agent, or Firm—Skjerven, Morrill, MacPherson, Franklin & Friel; Edward C. Kwok

[57] ABSTRACT

A circuit technique that substantially reduces the boost-converter losses caused by the reverse-recovery characteristics of the rectifier is described. The losses are reduced by inserting an inductor in the series path of the boost switch and the rectifier to control the di/dt rate of the rectifier during its turn-off. The energy from the inductor after the boost switch turn-off is returned to the input or delivered to the output via an active snubber. The same technique can be extended to any member of the PWM-converter family.

16 Claims, 20 Drawing Sheets

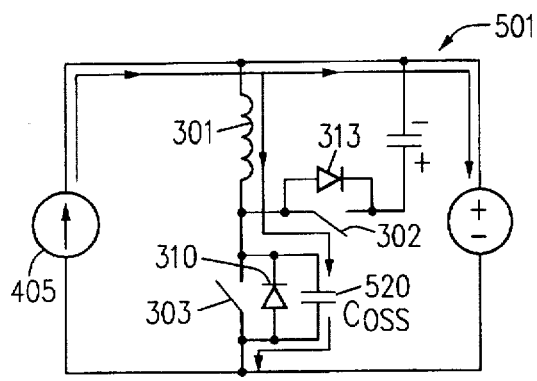
FIG. 5a [T0,T1]
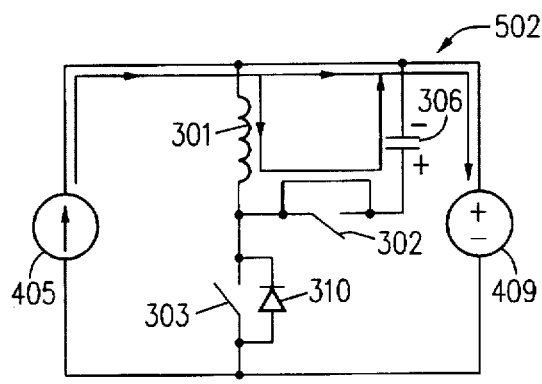
FIG. 5b [T1,T3]
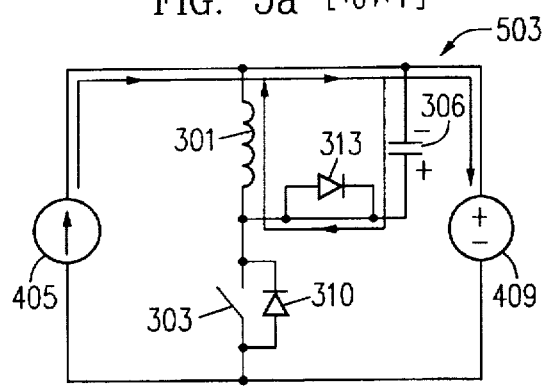
FIG. 5c [T3,T4]
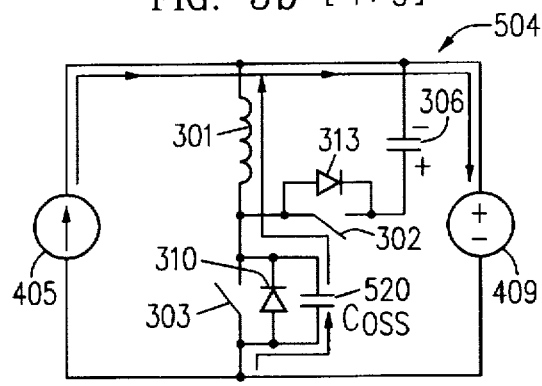
FIG. 5d [T4,T5]
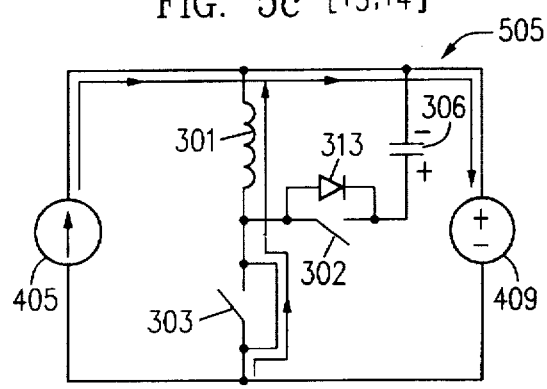
FIG. 5e [T5,T6]
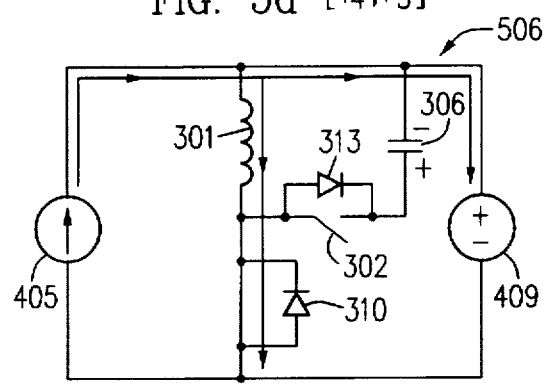
FIG. 5f [T6,T7]
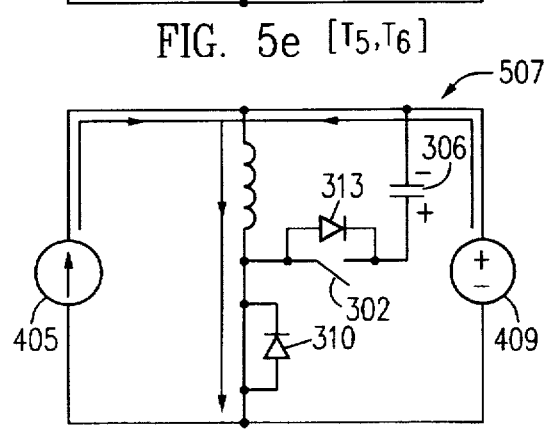
FIG. 5g [T7,T8]
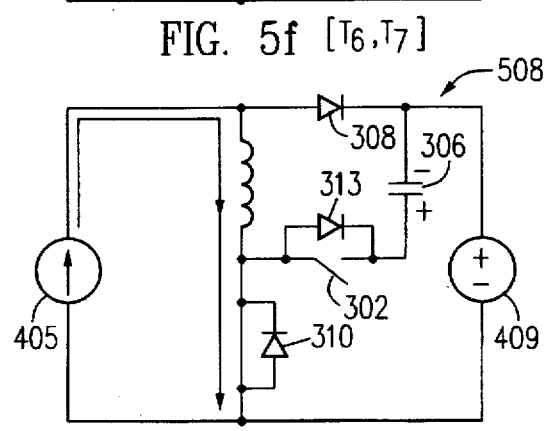
FIG. 5h [T8,T9]

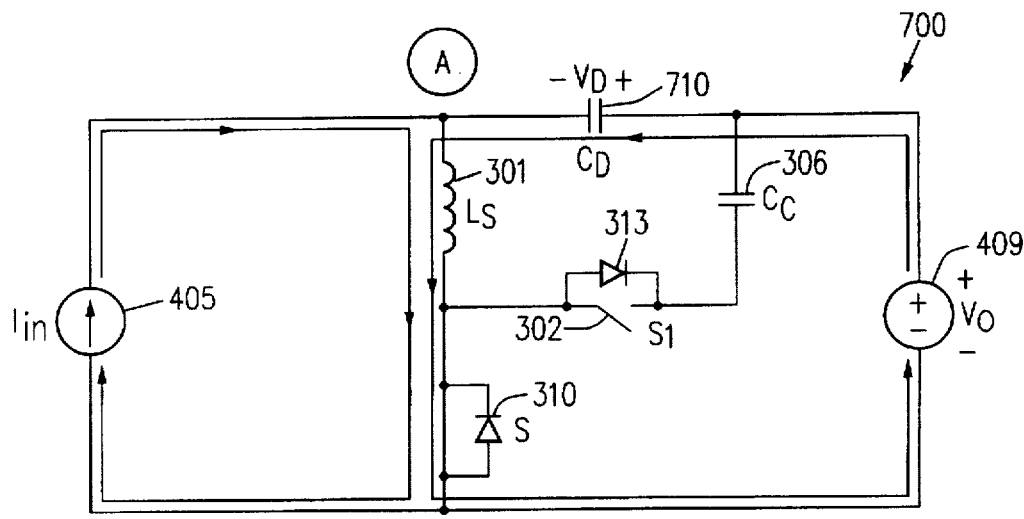
FIG. 7a [T8,T9]
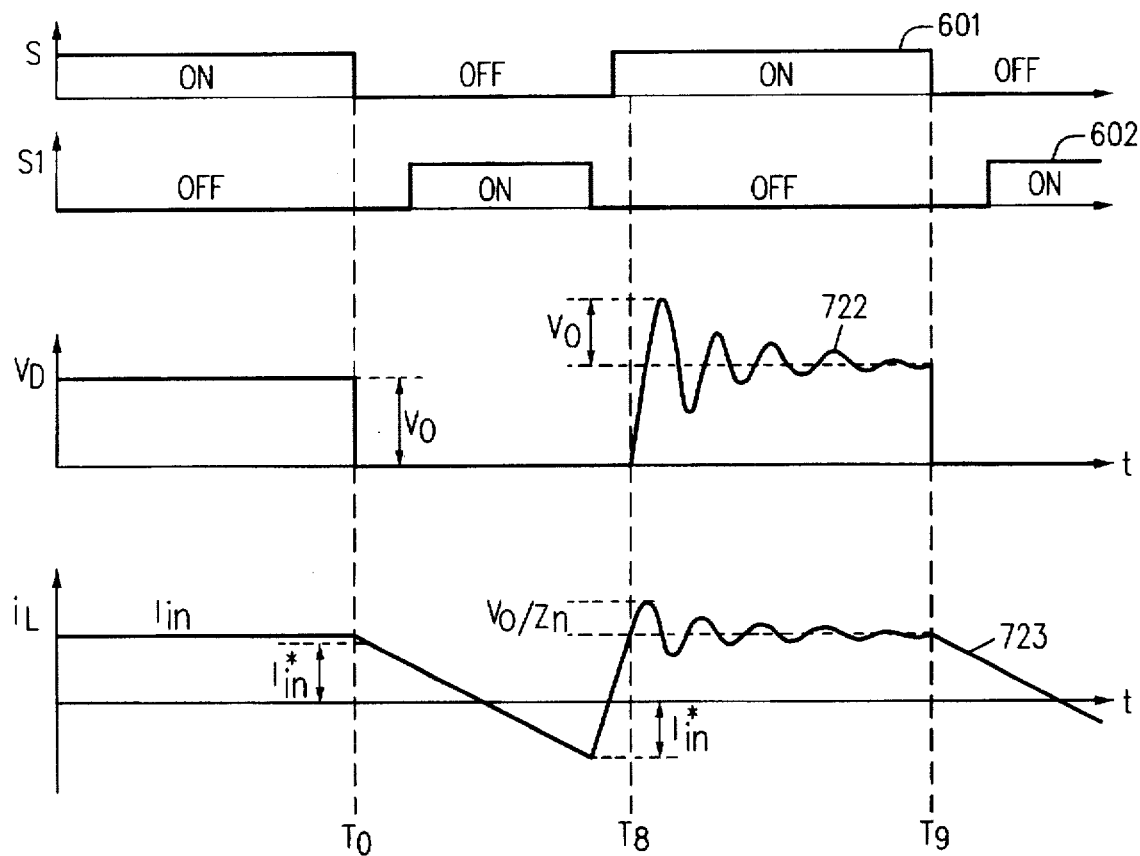
FIG. 7b 5,736,842

TECHNIQUE FOR REDUCING RECTIFIER REVERSE-RECOVERY-RELATED LOSSES IN HIGH-VOLTAGE HIGH POWER CONVERTERS

BACKGROUND OF THE INVENTION

1. Field of the Invention

The present invention relates to power converters. In particular, the present invention relates to the design of high-voltage, high-power, switch-mode boost converters.

2. Discussion of the Related Art

To achieve a higher power-conversion density, a switch-mode power processor is required to operate efficiently at a higher switching frequency. However, in a conventional "hard-switched", pulse-width modulation (PWM) converter, i.e. in a converter in which semiconductor switches are turned off while carrying substantial currents and turned on while supporting substantial voltages, a higher frequency of operation inevitably results in higher switching losses. Such switching losses limit the maximum frequency, and hence the maximum power density, under which such a converter can operate. In a converter intended for a high-voltage, high-power application, the switching loss is significant because of the relatively large parasitics of the semiconductor components in the converter. For example, in a converter using a fast-recovery rectifier, the switching loss due to the recovered charge in the rectifier is often the dominant factor in limiting the maximum operating frequency and the power density.

Thus, to achieve a higher operating switching frequency, while at the same time maintaining a reasonable efficiency, the switching losses must be minimized. To minimize or eliminate the switching losses, especially at turn-on and turn-off (i.e. to achieve zero-current or zero-voltage switching), a number of resonant, quasi-resonant, multi-resonant, and soft-switching techniques are developed. For example, the article "Merits and Limitations of Resonant and Soft-Switched Converters", by M. Jovanović, *International Telecommunication Energy Conf. Proc.*, pp. 51–57, October, 1992, discusses a number of such switching-loss reduction techniques. Typically, to achieve their zero-current or zero-voltage switching, these resonant, quasi-resonant, and multi-resonant ("resonant type") converters use high-frequency resonant-tank circuits to resonate either the currents or the voltages of semiconductor switches, or both. In these resonant type converters, due to resonance, the current and voltage stresses on the semiconductor components are increased, when compared to those in the corresponding "hard-switched" converters. Voltage and current stresses can result in a relatively poor semiconductor utilization and increased conduction losses. In fact, in these resonant type converters, switching losses are traded off with conduction losses. In addition, the resonant and multi-resonant converters circulate significant energies in their resonant tanks, causing additional conduction losses.

To overcome the increased semiconductor stresses and conduction losses in resonant type converters, a number of soft-switching techniques are developed. Typically, a soft-switching technique combines a "hard-switched" PWM converter technique with a resonant type converter technique so that the favorable characteristics of both techniques are preserved. Specifically, the soft-switching technique retains both the low current and low voltage stresses of a PWM converter, as well as the low switching loss of the resonant-type converter. In fact, a typical soft-switched converter operates as a PWM converter for most of the duration of a switching cycle, except during switching transitions when it operates as a resonant-type converter. As a result, a soft-switched converter possesses both square-type current and voltage waveforms, while exhibiting resonant-type transitions during turn-on and turn-off. In a bridge-type converter, soft-switching can be achieved by modifying the modulation scheme of the switches. However, in soft-switched, single-ended converters, e.g., forward and flyback converters, active snubbers are required. Soft-switched converters using active snubbers are disclosed in "Switched Snubbers for High Frequency Switching," by K. Harada et al, *IEEE Power Electronics Specialists'* Conf. Rec., pp. 181–188, June 1990.

Typically, soft-switching techniques can be applied to any high-frequency, non-isolated or isolated converter to improve one or more of the characteristics of electromagnetic interference (EMI) performance, conversion efficiency and power density. Recently, significant efforts have been made to develop a cost-effective soft-switching technique to improve the performance of the boost converter. The efforts are primarily motivated by the capabilities of a boost converter to achieve active input-current-shaping, which makes the boost converter the preferred front-end converter at higher power levels. See, for example, the discussion in "High Power Factor Preregulators for Off-line Supplies," by L. Dixon, *Unitrode Power Supply Design Seminar Manual*, SEM-700, pp. 12-1 to 12-16, 1990. Input-current-shaping, in addition to providing desirable improvements of the displacement power factor, controls the harmonic content of the input current, such as necessary for complying with the requirements of various regulatory agencies. An example of such requirements is found in "Electromagnetic Compatibility (EMC)—Part 3: Limits—Section 2, Limits for Harmonic current emissions (equipment input current $\leq$ 16 A per phase)", IEC 1000-3-2 Document, First Edition, 1995.

Depending on the intended applications, a boost converter which is used as a front-end, input-current shaper may receive as input a rectified mains voltage in the 90 V to 460 V (AC) range. Since the DC output voltage of a boost converter is higher than the peak of its input voltage, the output voltage of the boost input-current shaper is generally high. Consequently, such a boost converter requires a fast-recovery boost rectifier. At high-switching frequencies, a fast-recovery rectifier produces significant reverse-recovery-related switching losses under "hard-switching" conditions. This topic is discussed in "New Fast Recovery Diode Technology Cuts Circuit Losses, Improves Reliability," by Y. Khersonsky et al, *Power Conversion & Intelligent Motion (PCIM) Magazine*, pp. 16–25, May 1992. Because of this reverse-recovery-related switching loss, a hard-switched boost input-current-shaping converter is typically operated at relatively low switching frequencies to achieve an acceptable conversion efficiency.

From the above discussion, one can infer that, by employing a soft-switching technique, the switching frequency, and hence the power-density, of a front-end boost converter can be increased. So far, a number of soft-switched techniques used in boost converters and their variations have been proposed. Some articles discussing such soft-switched techniques can be found in, for example, (i) "High Efficiency Telecom Rectifier Using a Novel Soft-switched Boost-based Input Current Shaper" ("Streit"), by R. Streit et al, *International Telecommunication Energy Conf. Proc.*, pp. 720–726, October 1991; (ii) "Novel zero-voltage-transition PWM converters" ("Hua"), by G. Hua et al, *IEEE Power Electronics Specialists'* Conf. Rec., pp. 55–61, June 1992; and (iii) "New, Zero Voltage Switching, High Frequency Boost Converter Topology for Power Factor Correction," ("Basset") by J. Basset, *International Telecommunication Energy Conf. Proc.*, pp. 813–820, October 1995. In each of these soft-switched boost converters, an auxiliary active switch, together with a few passive components, e.g. inductors and capacitors, is used to control the rate of change of the rectifier current (the "di/dt rate"), so as to create conditions for zero-voltage switching ("ZVS") in the main switch and the rectifier. For example, Streit and Hua each use an inductor connected to the common node of the boost active switch and the rectifier to control the rectifier's di/dt rate.

FIG. 1(a) shows a boost converter 100 discussed in Hua. Boost converter 100 of FIG. 1(a) includes an inductor 105, a rectifier 108 and a main switch ("boost switch") 103 connected in a conventional boost converter topology. In addition, an auxiliary switch 102 is connected in series with an inductor 101 across the common electrical node 111 of inductor 105 and rectifier 108 ("boost" or "free-wheeling rectifier"), and the common negative terminal 112 of voltage source 104 and output capacitor 109. As a result of the position of inductor 101, the current and voltage stresses on main switch 103 and rectifier 108 are minimized. FIG. 1(b) shows the voltage waveforms 150 and 151 for controlling boost switch 103 and auxiliary switch 102, respectively. In FIG. 1(b), a high voltage level indicates that the corresponding switch is closed (i.e. conducting). As evident from voltage waveforms 150 and 151 of FIG. 1(b), boost switch 103 closes after auxiliary switch 102 has closed for a time duration $t_1$, such that inductor 101 pulls electrical node 111 towards the voltage on terminal 112. Consequently, boost switch 103 closes and rectifier 108 turns off under a zero-voltage (i.e. soft-switching) condition. However, auxiliary switch 102 closes when the voltage across its terminals is substantially equal to the output voltage $V_o$ across capacitor 109, and subsequently opens while carrying a current greater than the input current. Thus, auxiliary switch 102 experiences "hard" turn-on and turn-off, thereby dissipating more power than it would under soft-switching conditions. Nevertheless, the power dissipation in auxiliary switch 102, in a properly designed converter, is much smaller than the power dissipation of boost switch 103, since auxiliary switch 102 conducts only during switching transitions. The major drawback of boost converter 100 of FIG. 1(a) is the undesirable resonance of the parasitic output capacitance (not explicitly drawn in FIG. 1(b)) of the auxiliary switch 102 and inductor 101, which occurs when auxiliary switch 102 is open and after the current in inductor 101 falls to zero. This parasitic resonance generates an undesirable current through inductor 101 which increases the conduction losses and affects the functional operation of boost converter 100. Hua teaches that, to reduce the effect of this parasitic resonance, it is necessary to include a saturable inductor and a rectifier in series with inductor 101 and auxiliary switch 102. These additional components increases the cost of boost converter 100.

FIG. 2(a) shows a circuit 200 discussed in Bassett. FIG. 2(b) shows the voltage waveforms 250 and 251 across FIG. 2(a)'s boost switch 203 and auxiliary switch 202, respectively. As shown in FIG. 2(a), boost converter circuit 200 includes inductor 205, rectifier 208, boost switch 203, and output capacitor 209 connected in a conventional boost converter topology. In addition, an inductor 201 is provided in series with inductor 205 and rectifier 208. A clamping capacitor 206 is provided across the terminals of inductor 201, when auxiliary switch 202 is closed. In boost converter 200, the di/dt rate of the current in rectifier 208 is controlled by inductor 201. Because of the placement of inductor 201 in series with switch 203 and boost rectifier 208, the instantaneous voltage attained in boost switch 203, and hence the associated voltage stress, is higher than that of circuit 100 in FIG. 1(a). This increased voltage stress depends upon the capacitance $C_c$ of clamping capacitor 206. Clearly, a larger capacitance $C_c$ results in reduced stress. In Bassett's switching scheme, both boost switch 203 and auxiliary switch 202 switch under ZVS conditions. However, to achieve a ZVS condition in boost switch 203, a significant amount of energy is circulated in the resonant circuit of inductor 201 and clamp capacitor 206, whenever auxiliary switch 202 is closed. The energy stored in inductor 201 is returned to output node 214 through boost rectifier 208. During the time interval when both boost switch 203 and auxiliary switch 202 are open, the current in rectifier 208 is the sum of both the input current and the resonant current. Thus, the current stress in rectifier 206 is also higher than the corresponding boost rectifier 108 of FIG. 1(a). In order to achieve soft-switch conditions for boost switch 203, circuit 200 operates with a fixed duty cycle of auxiliary switch 202, i.e. auxiliary switch 202 is open only for a short fixed period of off-time. As shown in FIG. 2b, for circuit 200 to perform its proper function, the close times of auxiliary switch 202 and boost switch 203 must overlap.

SUMMARY OF THE INVENTION

The present invention reduces the reverse-recovery related losses of the boost rectifier by controlling the rate $di_D/dt$ of the rectifier current with an inductor connected in series with the boost switch and rectifier.

The power converter of the present invention includes (a) an input voltage source; (b) an output filter capacitor coupled in parallel with an output load; (c) a first inductor provided for storing energy from the input voltage source; (d) a rectifier; (e) a primary switch connected in series with the first inductor and controlled by a first control signal; and (f) an active snubber, including a second inductor, a clamping capacitor and an auxiliary switch controlled by a second control signal. According to the present invention, the closing of the primary switch couples the energy from the input voltage source to the first inductor and the closing of the auxiliary switch couples the second inductor and the clamping capacitor in series with a reference voltage source. When the primary switch is closed, the second inductor controls the rate of change of current in the rectifier and, when the primary switch is open, the energy stored in the second inductor is transferred through the clamping capacitor to the reference voltage source. The primary and auxiliary switches are closed at mutually exclusive time intervals. The reference voltage source can be any DC point, such as an output terminal, an input terminal, or the ground reference.

The power converter of the present invention can be implemented either as a non-isolated type or an isolated type. In one embodiment, the power converter is implemented as a non-isolated type. In that embodiment, the second inductor is connected in series with the primary switch and rectifier, when the primary switch is closed. In another embodiment, the power converter is implemented as an isolated type, the second inductor is provided in series with the primary coil of the isolating transformer. In yet another embodiment, the second inductor is provided in series with the secondary coil of the transformer. The power converter of the present invention can be implemented as a boost converter. In one embodiment, a tapped inductor is used to provide both the first and the second inductor.

The present invention is better understood upon consideration of the following detailed description and the accompanying drawings.

BRIEF DESCRIPTION OF THE DRAWINGS

FIGS. 5(a) to 5(h) show topological stages 501–508 of model 400, for time intervals [T0, T1], [T1, T3], [T3, T4], [T4, T5], [T5, T6], [T6, T7], [T7, T8] and [T5, T9] of a switching cycle, respectively.

FIG. 7(a) shows a topological stage 700 for model 400 during the time interval [$T_8$, $T_9$].

FIG. 7(b) shows (i) voltage waveforms 601 and 602, which represent control voltages on boost switch 303 and auxiliary switch 302, respectively; (ii) voltage waveform 722, representing the voltage $v_D$ of rectifier 308; and (iii) current waveform 723, representing current $i_L$ of inductor 301.

DETAILED DESCRIPTION OF THE PREFERRED EMBODIMENTS

Figure 1A:
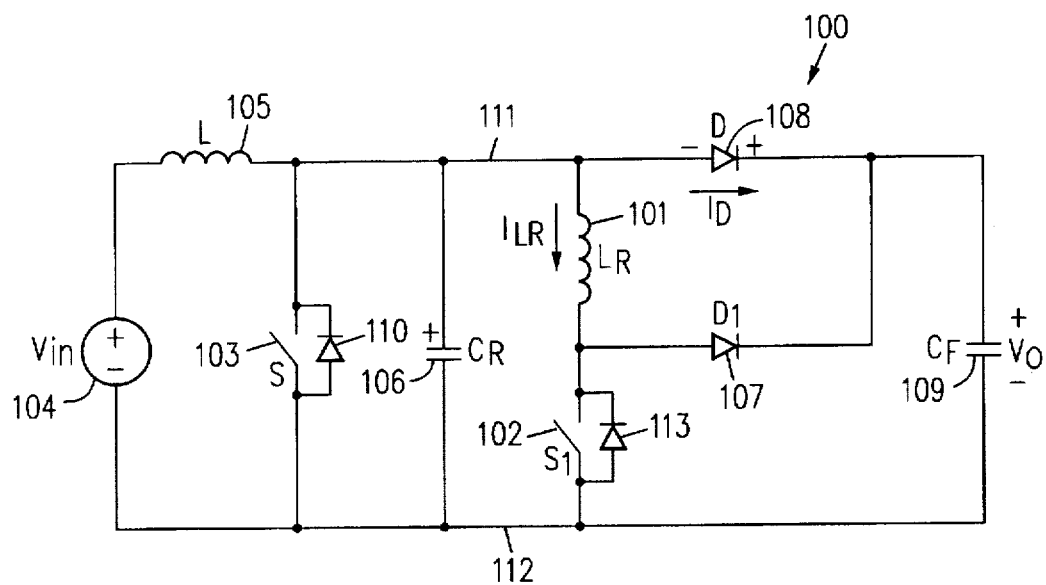
FIG. 1(a) shows a boost converter 100 discussed in a prior art reference.
Figure 1B:
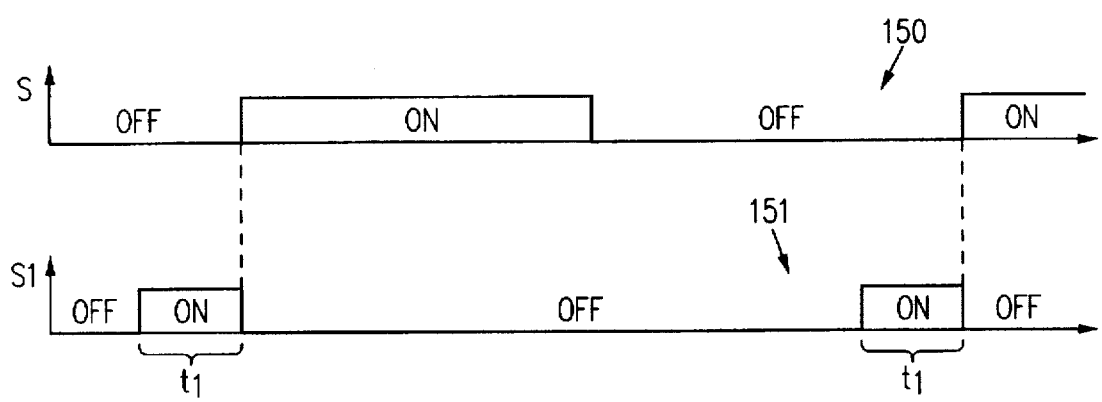
FIG. 1(b) shows the voltage waveforms 150 and 151 across FIG. 1(a)'s boost switch 103 and auxiliary switch 102, respectively.
Figure 2A:
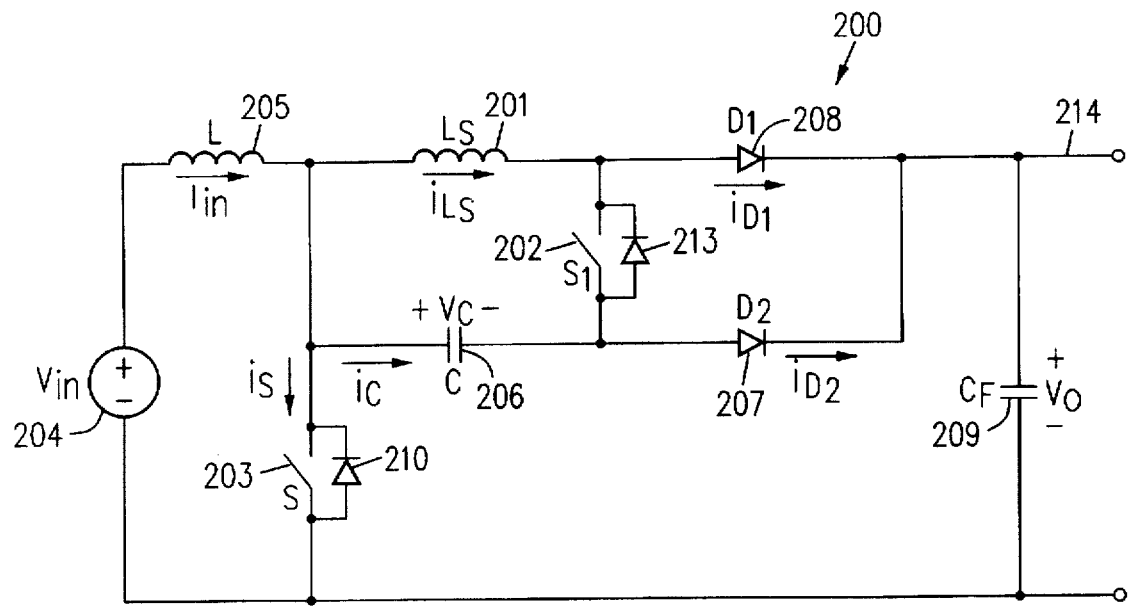
FIG. 2(a) shows a circuit 200 discussed in Bassett.
Figure 2B:
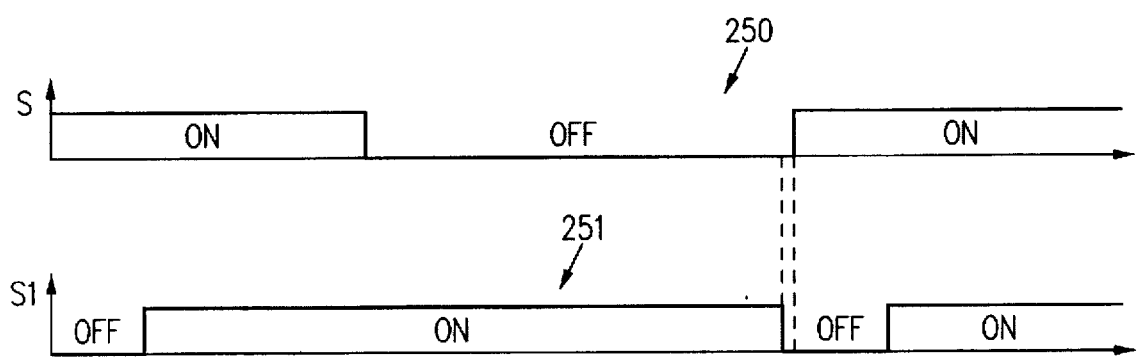
FIG. 2(b) shows the voltage waveforms 250 and 251 across FIG. 2(a)'s boost switch 203 and auxiliary switch 202, respectively.
Figure 3:
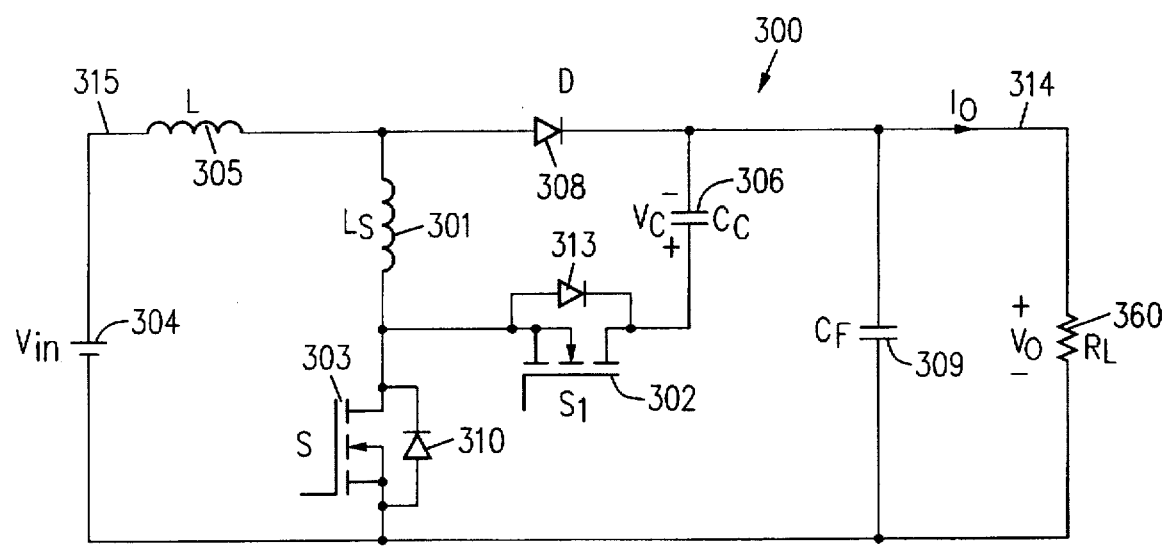
FIG. 3 shows a boost converter 300, which is one embodiment of the present invention.

The present invention, among other advantages, provides a boost converter which has reduced reverse-recovery loss. FIG. 3 shows a boost converter 300 in one embodiment of the present invention. As shown in FIG. 3, boost converter 300 includes boost inductor 305, boost switch 303, boost rectifier 308, and output filter capacitor 309 configured in a conventional boost converter configuration. The input and output ports of boost converter 300 are respectively an input voltage source 304 and a resistor 360 representing the load of circuit 300. In addition, an inductor 301 is provided in series connection with boost switch 303, between the common node of boost inductor 305 and boost rectifier 308 and boost switch 303. An auxiliary switch 302 is provided to couple a clamping capacitor 306 between output node 314 and boost switch 303. Thus, unlike Bassett's circuit 200 (FIG. 2a) above, which couples clamping capacitor 206 to the cathode of boost rectifier 208, clamping capacitor 306 of circuit 300 is coupled to the anode of boost rectifier 306. Further, when auxiliary switch 302 is closed, the energy in inductor 301 does not circulate or resonate in clamping capacitor 306. When auxiliary switch 302 is closed, capacitor 306 is connected in series with inductor 301 to discharge the energy stored in inductor 301 to output node 314. As is described below, the energy in inductor 301 can returned any DC voltage node in the circuit, e.g. output node 314, input node 315 or ground. In this embodiment, auxiliary switch 302 and boost switch 303 are both provided as N-channel MOSFETs[1]. Two anti-parallel diodes (internal body diodes of the MOSFETs), represented in FIG. 3 as rectifiers 310 and 313, are provided across boost switch 303 and auxiliary switch 302, respectively.

Figure 4:
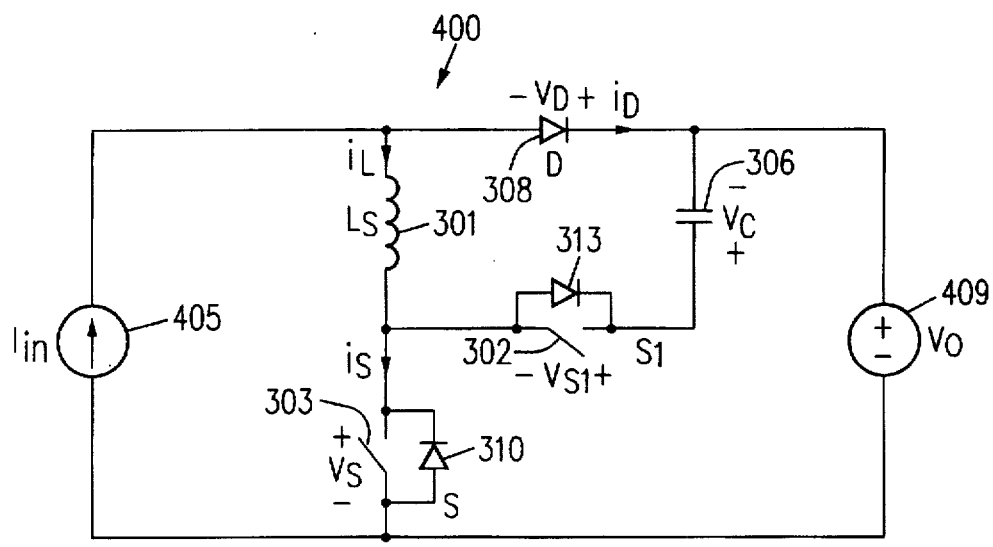
FIG. 4 shows a simplified model 400, which is used in this description to illustrate the operation of boost converter 300.

FIG. 4 shows a simplified model 400, which is used in this description to illustrate the operation of boost converter 300. Model 400 is obtained from boost converter 300 of FIG. 3, by assuming that the inductance of boost inductor 305 is so large that the combination of input voltage source 304 and boost inductor 305 can be represented by a constant-current source 405. Similarly, output filter capacitor 309 is assumed to be sufficiently large that the output ripple voltage can be considered negligible, so that the voltage across the output filter capacitor 309 can be represented by a constant-voltage source 409. In addition, model 400 further assumes that, when conducting, semiconductor switches, such as boost switch 303, auxiliary switch 302, and rectifiers 308, 310 and 313 exhibit practically zero resistances. Hence, in the following description, open switches are modelled as open circuits and closed switches are modelled as short circuits. However, the output capacitances of MOSFET switches, i.e. boost switch 303 and auxiliary switch 302, and the reverse-recovery charge of boost rectifier 308 are not considered insignificant in this analysis. To avoid confusion, in FIG. 4, and in the remainder of this specification, like elements are provided like reference numerals.

[1]MOSFET is the acronym for Metal-Oxide-Semiconductor Field Effect Transistor.

Figure 6:
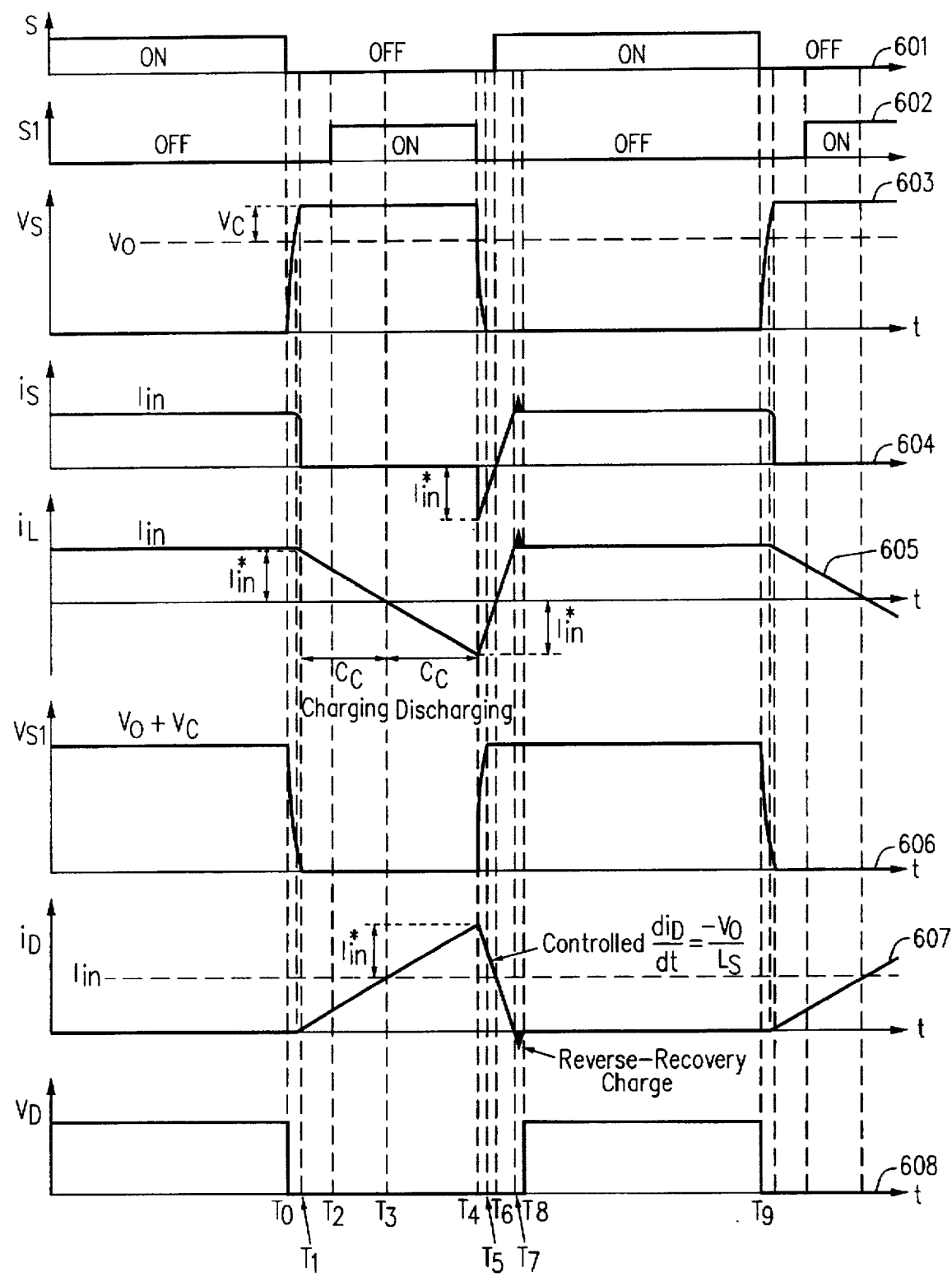
FIG. 6 shows, for time intervals corresponding to those of FIGS. 5(a) through 5(h), power-stage key waveforms of model 400.

To further explain the operation of boost converter 300, FIGS. 5(a) to 5(h) show topological stages 501–508 of model 400 for time intervals [T0, T1], [T1, T3], [T3, T4], [T4, T5], [T5, T6], [T6, T7], [T7, T8] and [T8, T9] of a switching cycle, respectively. FIG. 6 shows, for time intervals corresponding to those of FIGS. 5(a) through 5(h), power-stage key waveforms of model 400. Each of FIGS. 5(a) to 5(h) are considered below in conjunction with the waveforms of FIG. 6.

Referring to FIG. 6, waveforms 601 and 602 represent the voltage signals S and $S_1$ for controlling boost switch 303 and auxiliary switch 302, respectively. The corresponding voltage waveforms for the voltages $v_s$ and $v_{s1}$ across boost switch 303 and auxiliary switch 302 are provided as waveforms 603 and 606, respectively. The current $i_s$ in boost switch 303 is provided as current waveform 604. The current $i_L$ in inductor 301 is provided as current waveform 605, and the current $i_D$ and voltage $v_D$ of boost rectifier 308 are provided as waveforms 607 and 608 respectively. As can be seen from voltage waveforms 601 and 602, boost switch 303 and auxiliary switch 302 are controlled such that, at any given time, at most one of these switches is allowed to be conducting. In fact, as shown in voltage waveforms 601 and 602, an appropriate dead time between the opening of boost switch 303 and the closing of auxiliary switch 302, i.e. during the interval [$T_0$, $T_2$], is required to ensure proper operation of power converter 300. Similarly, an appropriate dead time is provided between the opening of auxiliary switch 302 and the closing of boost switch 303, i.e. during the interval [$T_4$,$T_6$].

Referring to FIGS. 4 and 6, before boost switch 303 opens at t=$T_0$, auxiliary switch 302 is opened and input current $I_{in}$ of current source 405 flows through inductor 301 and boost switch 303. At the same time, rectifier 308 is reverse-biased by output voltage $V_o$, and auxiliary switch 302 has a voltage across it equal to the sum of output voltage $V_o$ and voltage $V_c$ across clamping capacitor 306. FIG. 5(a) shows a topological stage 501 of model 400 during the time interval [$T_0$, $T_1$]. Referring now to FIGS. 5(a) and 6, at time $T_0$, boost switch 303 opens, the current $i_s$ previously in boost switch 303 charges boost switch 303's parasitic output capacitance $C_{oss}$, which is represented in FIG. 5(a) as capacitor 520, so that the voltage $v_s$ across boost switch 303 rises. As the rising voltage $v_s$ of boost switch 303 reaches output voltage $V_o$, current $i_L$ in inductor 301 starts decreasing. Since input current $I_{in}$ is assumed to be substantially constant, rectifier 308 conducts the difference between input current $I_{in}$ and inductor current $i_L$. As the voltage $v_s$ across boost switch 303 rises, the voltage $v_{s1}$ across open auxiliary switch 302 falls, reaching zero at time $T_1$, when rectifier 313 starts conducting. This condition is illustrated in FIG. 5(b) by a topological stage 502 of model 400 for the time interval [$T_1$, $T_3$]. Thus, at time $T_1$, the voltage $v_s$ across boost switch 303 reaches $V_o$+$v_c$, whereupon the remaining inductor current $i_L$ of inductor 301 charges clamping capacitor 306. If the capacitance $C_c$ of clamping capacitor 306 is sufficiently large, the voltage across clamping capacitor 306 remains substantially constant, and inductor current $i_L$ of inductor 301 decreases linearly, reaching zero at time $T_3$. Otherwise, inductor current $i_L$ decreases in a resonant fashion. Rectifier current $i_D$ of rectifier 308 increases at the same rate, since the sum of currents $i_D$ and $i_L$ is constrained by constant input current $I_{in}$. When inductor current $i_L$ of inductor 301 reaches zero at time $T_3$, the rectifier 313 stops conducting. To allow auxiliary switch 302 to close under a zero-voltage switching condition (i.e. ZVS), auxiliary switch 302 has to close before time $T_3$, while rectifier 313 is conducting. Thus, as shown in FIG. 6, auxiliary switch 302 is closed at time $T_2$ during time interval [$T_1$, $T_3$].

FIG. 5(c) shows topological stage 503 of model 400 for the time interval [$T_3$, $T_4$]. With auxiliary switch 302 closed, inductor current $i_L$ continues to decrease after $T_3$, i.e. the direction of current flow of inductor current $i_L$ is reversed, with current $i_L$ being provided by discharging clamping capacitor 306. This condition is represented by topological stage 503 of FIG. 5(c). As clamping capacitor 306 begins to discharge at time $T_3$, current $i_D$ in rectifier 308 exceeds input current $I_{in}$, reaching a maximum at time $T_4$, when auxiliary switch 302 is opened.

FIG. 5(d) shows topological state 504 of model 400 for the time interval [$T_4$, $T_5$]. When auxiliary switch 302 is opened at time $T_4$, the discharge of clamping capacitor 306 is abruptly terminated, and boost switch 303's parasitic output capacitor 520 is discharged to sustain inductor current $i_L$ of inductor 301. Thus, voltage $v_s$ across boost switch 303 decreases from $V_o$+$V_c$, reaching zero at time $T_5$.[2] As boost switch 303's parasitic output capacitor is discharged, inductor current $i_L$ of inductor 301 increases, and current $i_D$ of rectifier 308 decreases toward $I_{in}$.

FIG. 5(e) shows topological stage 505 of model 400, for the time interval [$T_5$, $T_6$]. When voltage $v_s$ across boost switch 303 reaches zero at time $T_5$, inductor current $i_L$ is still negative, so that rectifier 310 of boost switch 303 begins to conduct. Because both rectifier 310 and boost rectifier 308 are simultaneously conducting during time interval [$T_5$, $T_6$], output voltage $V_o$ is imposed across inductor 301, such that inductor current $i_L$ increases linearly toward zero. To ensure that boost switch 303 closes under ZVS conditions, boost switch 303 is closed prior to or at time $T_6$, i.e. while rectifier 310 is conducting. Because boost switch 303 is closed during time interval [$T_5$, $T_6$], inductor current $i_L$ continues to linearly increase after time $T_6$, and hence current $i_D$ of rectifier 308 continues to decrease linearly. This condition is illustrated in FIG. 5(f), which shows topological stage 506 of model 400 for the time interval [$T_6$, $T_7$]. The rate of decrease in rectifier current $i_D$ is determined by inductance $L_s$ of inductor 301, since the sum of current $i_D$ and current $i_L$ is constrained by input current $I_{in}$. Thus, $$di_D/dt = -V_o/L_s \quad (1)$$

[2]Whether voltage $V_s$ of boost switch 303 will reach zero depends on the energy stored in inductor 301 at time $T_4$. If, at time $T_4$, the energy in inductor 301 is larger than the energy in parasitic output capacitor 520 of boost switch 303, i.e., $$\frac{1}{2} L_s I_L^2 \geq \frac{1}{2} C_{oss}(V_o + V_c)^2$$

then voltage $V_s$ will reach zero. Otherwise, voltage $V_s$ will oscillate around voltage $V_{in}$, i.e., the voltage on voltage source 305, if boost switch 303 is not closed immediately after voltage $V_s$ reaches a minimum value.

A proper inductance $L_s$ for inductor 301 should be selected to reduce the rectifier recovered charge and the associated efficiency loss. Typically, as can be seen from equation (1) above, the larger an inductance is selected for inductance $L_s$, the smaller the rate of change in the rectifier current $i_D$ is, and thus resulting in a smaller reverse-recovery associated efficiency loss.

The increase in inductor current $i_L$ should ideally stop at time $T_7$, when inductor current $i_L$ equals input current $I_{in}$, and rectifier current $i_D$ reaches zero. However, as current $i_D$ of rectifier 308 reaches zero, the residual stored charge in rectifier 308 provides a reverse-recovery current, which produces an overshoot, over input current $I_{in}$, in both inductor current $i_L$ and switch current $i_s$. With a suitably selected inductance $L_s$, this reverse-recovery current can be made much reduced. At time $T_8$, the reverse-recovery current of rectifier 308 is exhausted, and input current $I_{in}$ flows through boost switch 303 and inductor 301, until the next switching cycle is initiated at time $T_9$. FIG. 5(h) shows topological stage 508 of model 400, for the time interval [$T_8$, $T_9$].

As described above, to allow both boost switch 303 and auxiliary switch 302 to switch under ZVS conditions, boost switch 303 and auxiliary switch 302 are each switched when each switch's antiparallel diode, i.e. rectifier 310 or rectifier 313, is conducting. As discussed above in conjunction with FIGS. 5(a) and 6, after switch 303 is opened at time $T_0$, rectifier 313 begins to conduct at time $T_1$, when voltage $v_s$ across boost switch 303 reaches the sum of voltage across clamping capacitor 306), as a result of parasitic output capacitor 520 being charged by inductor current $i_L$. Since the inductance of boost inductor 305 is relatively large (typically much larger than the inductance $L_s$ of inductor 301), the energy stored in boost inductor 305 even at very low input current $I_{in}$ is large enough to have the voltage across parasitic output capacitor 520 of boost switch 303 reach the intended voltage $V_o+V_c$. However, after auxiliary switch 302 is opened at time $T_4$, to allow boost switch 303 to switch under a ZVS condition, parasitic output capacitor 520 must be discharged (see FIG. 5(d), time interval [$T_4$, $T_5$]), and subsequently, rectifier 310 must be turned on (see FIG. 5(e), time interval [$T_5$, $T_6$]). To achieve the discharging of parasitic output capacitor 520, and to turn on rectifier 310, only the energy stored in inductor 301 is available, since current $I_{in}$ of boost inductor 305 now flows substantially in rectifier 308. The energy in inductor 301 can be increased by increasing either inductance $L_s$, or inductor current $i_n$. Because of charge conservation during charging and discharging of clamping capacitor 306 during time intervals [$T_1$, $T_3$] and [$T_3$, $T_4$] respectively, the magnitudes of current $i_L$ at times $T_1$ and $T_4$ are substantially equal. Further, if duration of the commutation interval [$T_0$, $T_1$] is short, when compared to the off-time interval [$T_0$, $T_6$], current $i_L$ at time $T_1$ is substantially the input current $I_{in}$. Thus, current $i_L$ is therefore constrained by input current $I_{in}$, so that the only design variable available for increasing the stored energy in inductor 301 is inductance $L_s$. The minimum $L_s$ is determined from the desired rate of change of rectifier current $i_D$ (i.e. $di_D/dt$) in rectifier 308. As mentioned above, a lower $di_D/dt$ provides a smaller rectifier recovered charged-related efficiency loss. Therefore, to achieve a ZVS condition at light loads, i.e., for small $I_{in}$, a relatively large value of inductance $L_s$ is necessary to ensure rectifier 310 turns on. However, if the selected inductance $L_s$ is too large, the rate of change of inductor current $i_L$, i.e. $di_L/dt$, will be very slow, thus limiting the maximum operating switching frequency and maximum output power attainable. Therefore, in a practical design, inductance $L_s$ of inductor 301 should be selected to be larger than the minimum $L_s$, which provides the desired $di_D/dt$ rate, but not large enough to limit the switching frequency or maximum output power attainable. Although, for such a selection of inductance $L_s$, a ZVS switching condition for boost switch 303 may not be possible, the switching loss of boost switch 303 would be reduced because boost switch 303 would be turned on with voltage $v_s$ across boost switch 303 being lower than $V_o+V_c$.

In considering the operation and efficiency of a fast-recovery rectifier, besides the stored charge that is recovered, the rectifier's parasitic junction capacitance is also a factor. The rectifier's junction capacitance, which is neglected in the analysis above, increases the voltage stress of the rectifier, and thus has a detrimental effect on circuit characteristics. FIG. 7(a) shows a topological stage 700 for model 400 during the time interval [$T_8$, $T_9$]. Topological stage 700 differs from topological stage 508 of FIG. 5(h) in that non-conducting rectifier 308 in topological stage 508 is represented in topological stage 700 by a capacitor 710. FIG. 7(b) shows (i) voltage waveforms 601 and 602, which represent control voltages on boost switch 303 and auxiliary switch 302, respectively; (ii) voltage waveform 722, representing the voltage $v_D$ of rectifier 308; and (iii) current waveform 723, representing current $i_L$ of inductor 301. As shown in FIG. 7(b), by time $T_8$, the stored charge in rectifier 308 has been removed, i.e. rectifier 308 has recovered, and junction capacitor 710 of rectifier 308 begins charging to output voltage $V_o$. Since junction capacitor 710 of rectifier 308 and inductor 301 form a series-resonant circuit, the voltage $v_D$ across junction capacitor 710 (i.e. the voltage across rectifier 308) and the current $i_L$ of inductor 301 resonate, as shown in FIG. 7(b) by voltage waveform 722 and current waveform 723, respectively. The resonance is dampened by both the on-resistance of boost switch 303 and the loss in inductor 301. The peak amplitudes $v_D^{osc}$ and $i_L^{osc}$ of the oscillations in voltage $v_D$ and current $i_L$ are given by:

$$v_D^{osc} = V_o \qquad (2)$$

$$i_L^{osc} = \frac{V_o}{Z_n} = \frac{V_o}{\sqrt{\frac{L_s}{C_D}}} \qquad (3)$$

where $Z_n$ is the characteristic impedance of the LC resonant circuit formed by junction capacitor 710 and inductor 301, and $C_D$ is the capacitance of junction capacitor 710. Typically, the characteristic impedance $Z_n$ is large because of the relatively small capacitance of junction capacitor 710, which is typically in the 10–50 picofarad range. Consequently, the energy stored in the LC resonant circuit is also small. However, the resonance of voltage $v_D$ doubles the voltage stress of rectifier 308 as the voltage at node A (FIG. 7(a)) reaches $-V_o$.

Figure 8A:
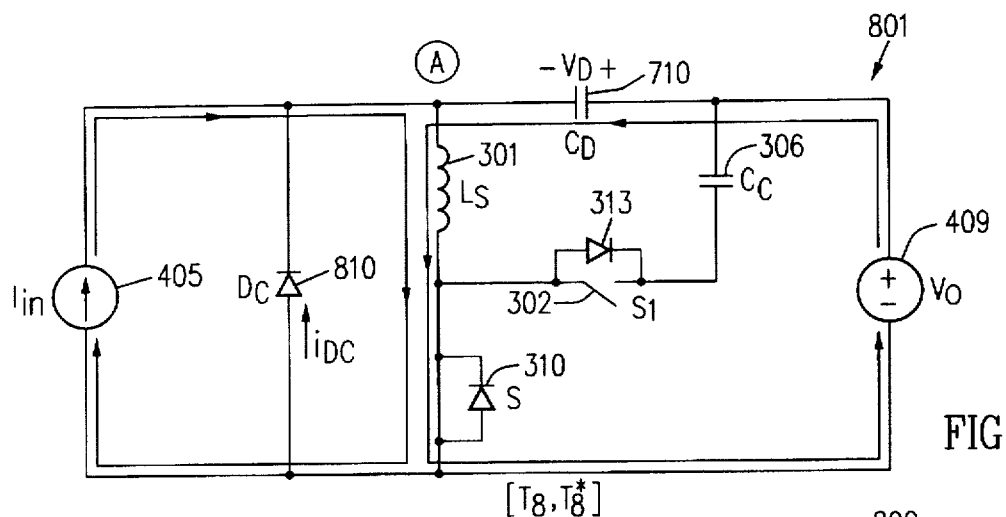
FIGS. 8(a) and 8(b) show topological stages 801 and 802 for model 400, when diode 810 is included, for time intervals [$T_8$, $T_8^*$] and [$T_8^*$, $T_9$], where time $T_8^*$ corresponds to the time when the voltage at node A reaches zero.
Figure 8B:
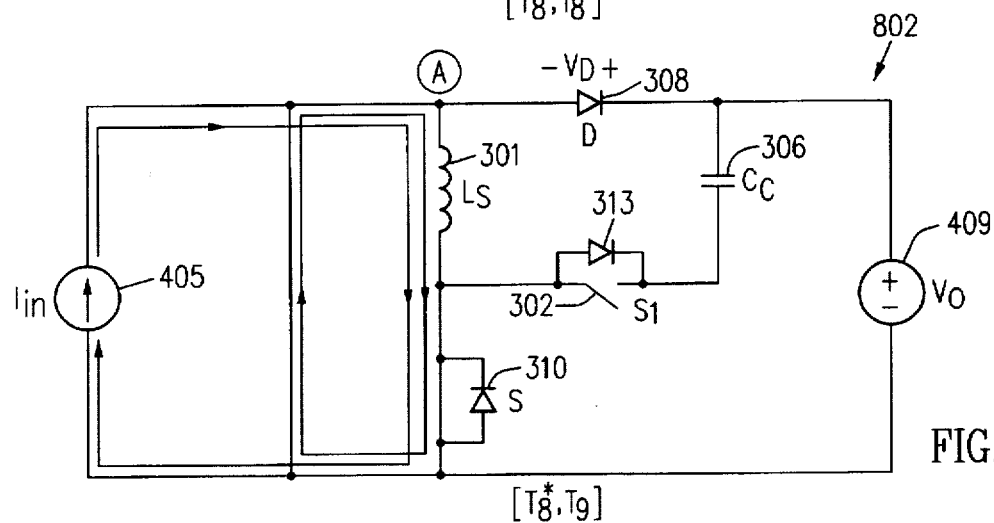
Figure 8C:
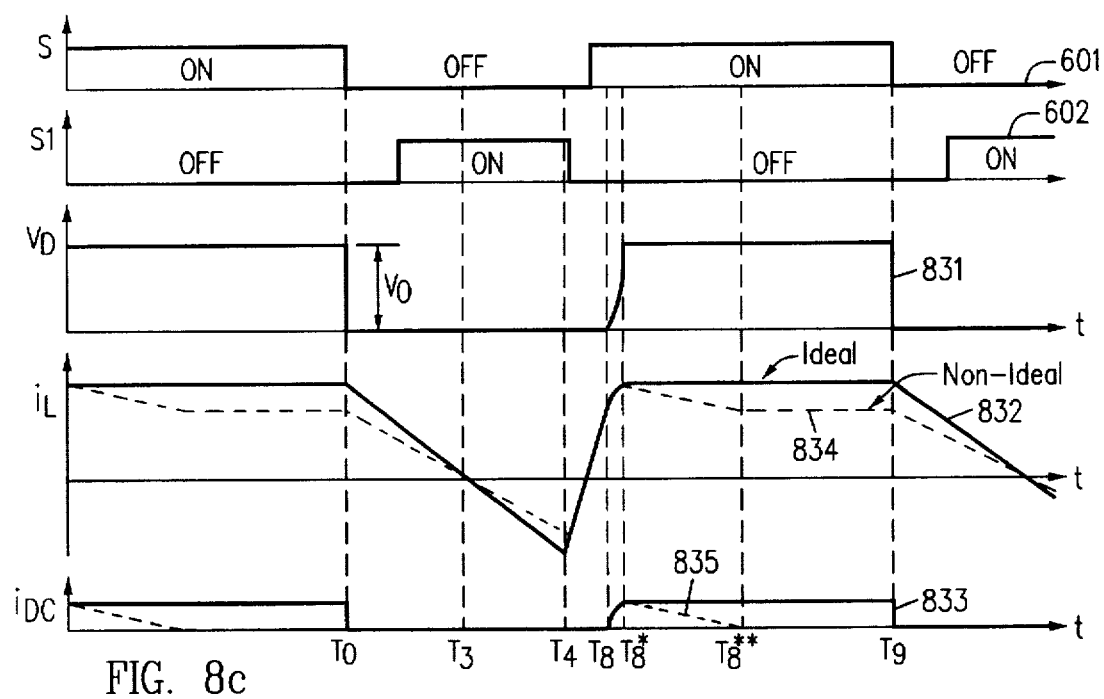
FIG. 8(c) shows (i) voltage waveforms 601 and 602, which represent control voltages on boost switch 303 and auxiliary switch 302, respectively; (ii) voltage waveform 831, representing the voltage $v_D$ of rectifier 308; (iii) current waveform 832, representing current $i_L$ of inductor 301; and (iv) current waveform $i_{DC}$, representing the current in diode 810.

The oscillation in the LC circuit of inductor 301 and parasitic junction capacitor 710 can be eliminated by clamping the voltage of node A to the ground by a diode, such as diode 810 shown in FIG. 8(a). FIGS. 8(a) and 8(b) show topological stages 801 and 802 for model 400, when diode 810 is included, for time intervals [$T_8$, $T_8^*$] and [$T_8^*$, $T_9$], where time $T_8^*$ corresponds to the time when the voltage at node A reaches zero. FIG. 8(c) shows (i) voltage waveforms 601 and 602, which represent control voltages on boost switch 303 and auxiliary switch, respectively; (ii) voltage waveform 831, representing the voltage $v_D$ of rectifier 308; (iii) current waveform 832, representing current $i_L$ of inductor 301; and (iv) current waveform $i_{DC}$, representing the current waveform of diode 810. When the voltage at node A reaches zero, i.e., when the reverse voltage on rectifier 308 reaches $V_o$, diode 810 clamps the voltage of node A to zero by shunting current $i_L$, as shown in FIG. 8(b). Ideally, current $i_L$, which circulates in the loop of inductor 301 and diode 810 remains constant at $i_L^{osc}$, i.e. the peak amplitude of the LC resonant circuit of junction capacitor 710 and inductor 301, until boost switch 303 opens at time $T_9$. However, in a practical implementation, current $i_L$ in inductor 301 decays according to:

$$di_L/dt = -(V_F + (R_{S(on)} + R_L)i_L) \quad (4)$$

where $V_F$ is the forward voltage drop of clamping diode 810, $R_{S(on)}$ is the on-resistance of boost switch 303, and $R_L$ is the winding resistance of inductor 301. The decay in currents $i_L$ and $i_{DC}$ are illustrated by waveforms 834 and 835 of FIG. 8(c). Typically, the power dissipated in the loop of diode 810 and inductor 301 is negligible because the circulating current is small. When diode 810 is included, the reverse voltage of boost rectifier 308 is output voltage $V_o$.

Referring back to FIG. 6, voltage waveforms 603 and 606 show that the voltage stresses of boost switch 303 and auxiliary switch 302 are each equal to the sum of output voltage $V_o$ and the voltage $V_c$ of clamping capacitor 306. Compared to a conventional "hard-switched" boost converter, the boost-switch voltage stress in boost converter 300 is higher by $V_c$. Thus, the capacitance $C_c$ of clamping capacitor 306 is chosen to reasonably minimize the voltage stresses of boost switch 303 and auxiliary switch 302. Referring to current waveform 605, which represents current $i_L$ of inductor 301, clamp capacitor 306 is charged by current $i_L$ during time interval $[T_1, T_3]$. Since $i_L$ is approximately equal to $I_{in}$ at time $T_1$ and time interval $[T_1, T_3]$ is approximately one-half of the off-time of boost switch 303, the voltage $V_c$ across clamping capacitor 306 is given by:

$$V_c = \frac{Q}{C_c} = \frac{\frac{1}{2} I_{in} \frac{T_{off}}{2}}{C_c} = \frac{I_{in}(1-D)}{4 C_c f_s} \quad (5)$$

where D and $f_s$ are respectively the duty cycle and the switching frequency of boost switch 303. Note that $V_c$ does not depend on the inductance $L_s$ of inductor 301.

For a lossless boost power converter, input current $I_{in}$ is related to the output current $I_o$, as $$I_{in} = \frac{V_o}{V_{in}} I_o = \frac{I_o}{1-D} \quad (6)$$

Thus, voltage $V_c$ across clamping capacitor 306 can also be expressed as:

$$V_c = \frac{I_o}{4 C_c f_s} \quad (7)$$

Thus, for a given maximum clamping voltage level $V_c$, the desired capacitance $C_c$ can be determined from the maximum output current $I_o$ and the switching frequency $f_s$ of boost switch 303. If a large value is selected for capacitance $C_c$, voltage $V_c$ is essentially a constant DC voltage under steady state conditions.

Figure 9A:
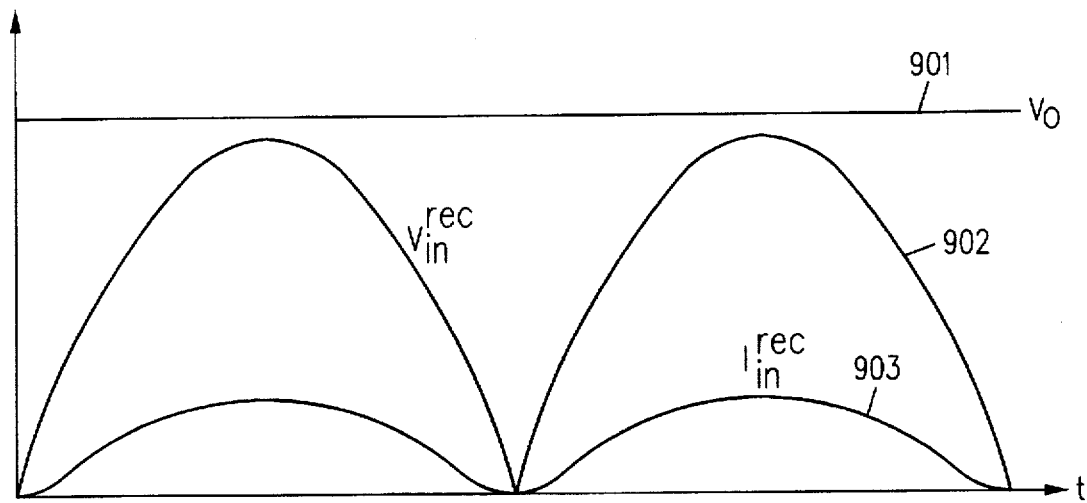
FIG. 9(a) shows the desired input current waveform 903, input voltage waveform 902 and an output voltage waveform 901 for an input-current-shaping application.
Figure 9B:
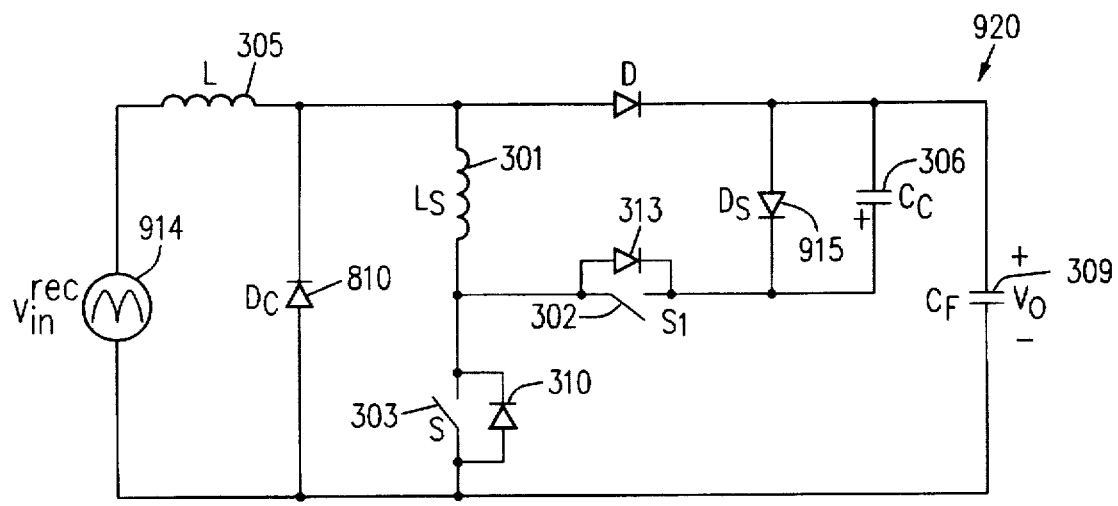
FIG. 9(b) shows a boost converter 920, which includes diodes 810 and 915, in addition to the components of boost converter 300 of FIG. 3.

As mentioned above, a boost converter is often used for an input-current-shaping application. The main objective of input-current-shaping in a power supply is to reduce the harmonic content and to improve the power factor of the line current. Typically, a boost power stage is used, in conjunction with a control scheme, to force the input current (i.e. the current through the boost converter) to follow a current reference proportional to the line voltage. FIG. 9(a) shows the desired input current waveform 903, input voltage waveform 902 and an output voltage waveform 901 for an input-current-shaping application. In such an application, the input voltage $V_{in}$ of the boost power stage, e.g. voltage waveform 902, is a rectified line voltage, while the output voltage $V_o$, e.g. voltage waveform 901, is a DC voltage greater than the peak of $V_{in}$. Depending on the instantaneous value of input voltage $V_{in}$ and the magnitude of the constant output voltage $V_o$, the duty cycle of a boost converter used in such an application varies over a wide range. The duty cycle can be close to 100% when voltage $V_{in}$ is low (around zero), and the duty cycle reaches a minimum at the peak of voltage $V_{in}$. However, when the instantaneous line voltage is around zero, the energy in boost inductor 305 is small even when the switch duty cycle is close to 100%. As a result, when boost switch 303 opens at time $T_0$, the stored energy in boost inductor 305 may be insufficient to charge parasitic output capacitor 520 (FIG. 5 (a)), with capacitance $C_{oss}$) of boost switch 303 up to the voltage $V_o + V_c$ to cause rectifier 313 of auxiliary switch 302 to conduct. Consequently, when auxiliary switch 302 closes at time $T_2$, clamping capacitor 306 discharges to parasitic output capacitor 520. Since capacitance $C_c$ of clamping capacitor 306 is typically much larger than capacitance $C_{oss}$ of parasitic capacitor 520, such a discharge is small in any switching cycle. However, cumulatively, i.e., over a large number of switching cycles, the decrease in voltage $V_c$ across clamping capacitor 306 can become significant. To maintain proper operation of boost converter 300 of FIG. 3, clamping voltage $V_c$ should be kept positive, to allow sufficient volt-second product for resetting inductor 301's core. Accordingly, as shown in boost converter 920 of FIG. 9(b), a diode 915, typically of the Schottky type, is added across clamping capacitor 306. In FIG. 9(b), boost converter 920 is obtained by including diodes 810 and 915 discussed above. Also, in FIG. 9(b), voltage source 304 is replaced by voltage source 914 to underscore that input voltage source 914 can be time-varying.

Figure 10:
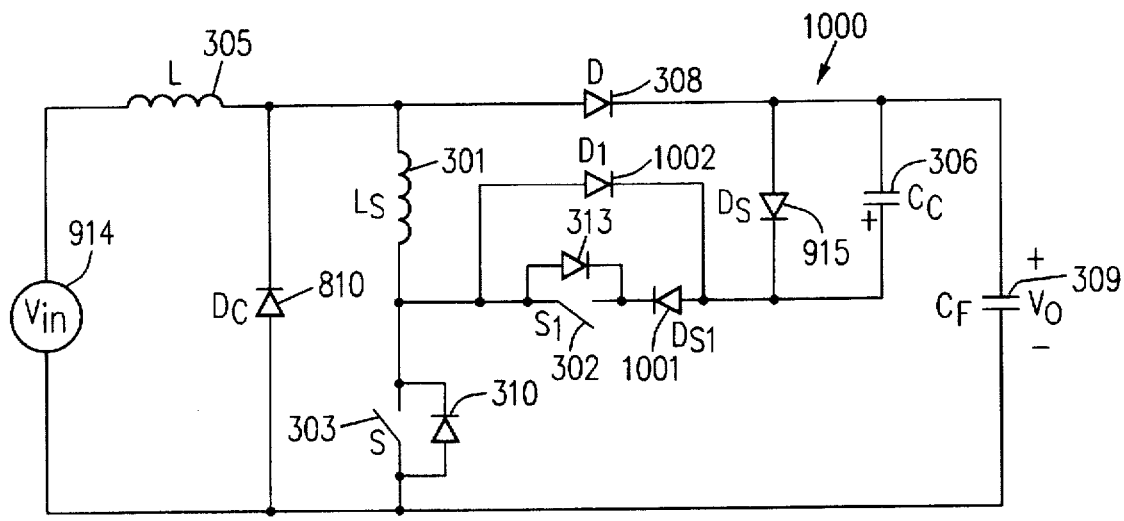
FIG. 10 shows a boost converter 1000 of the present invention suitable for operating at a high duty cycle of boost switch 303.

In the present invention, boost switch 303 and auxiliary switch 302 do not simultaneously conduct, using a control driver circuit to provide non-overlapping control signals S and $S_1$. For converters operating with duty cycles significantly less than 100%, e.g., less than 75%, boost converters 300 and 920 of FIGS. 3 and 9(b) are reliable implementations. However, for converters operating at duty cycles close to 100%, the slow reverse-recovery characteristic of rectifier 313 may lead to circuit malfunctioning and failure, especially during line or load transients. Namely, for duty cycles close to 100%, auxiliary switch 302 is closed for only a relatively short time interval. Consequently, diode 313, which conducts inductor current $i_L$ during time interval $[T_1, T_2]$, after boost switch 303 is opened at time $T_0$, may not have sufficient time to recover fully before boost switch 303 closes again at time $T_6$ (FIG. 6). To counteract the slow reverse-recovery characteristic of rectifier 313, diode 1001, preferably of the Schottky type, and fast-recovery diode 1002 are provided in boost converter 1000 of FIG. 10. Diode 1001 is connected in series with auxiliary switch 302 to block conduction of rectifier 313, whereas fast-recovery diode 1002 is used to provide a path for current $i_L$ of inductor 301.

Figure 11A:
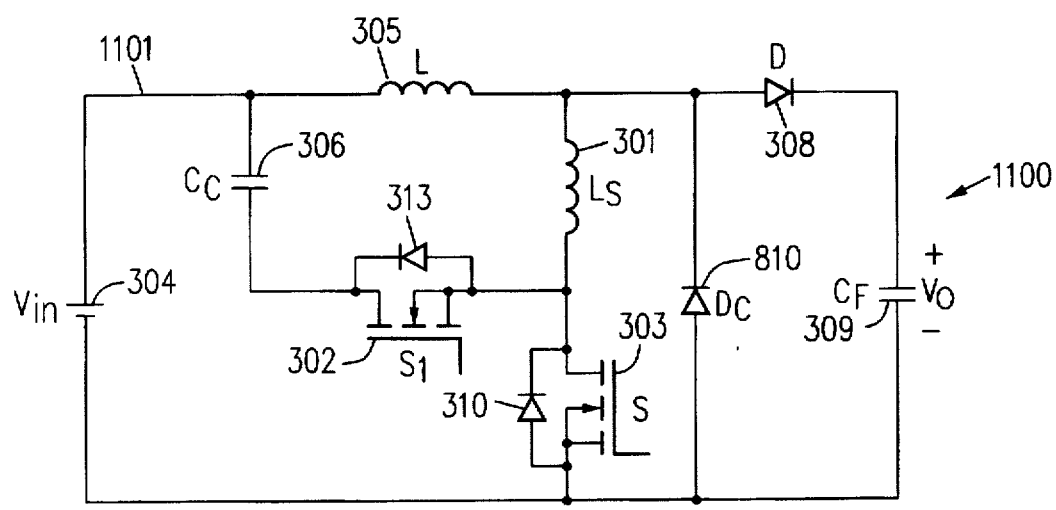
FIG. 11(a) shows another embodiment of the present invention in a boost converter 1100, with a clamping capacitor coupled to the input.
Figure 11B:
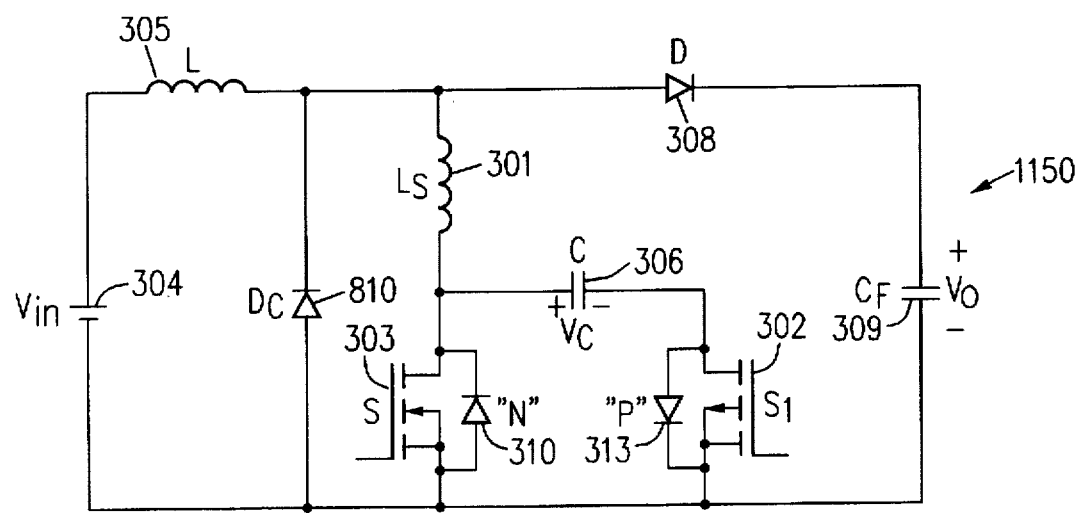
FIG. 11(b) shows yet another embodiment of the present invention in a boost converter 1150, with a clamping capacitor connected to the ground.

It should be noted that, generally, the series connection of auxiliary switch 302 and clamping capacitor 306 can be connected to any DC voltage point in the boost converter circuit. Thus, the present invention can be applied to reduce reverse-recovery related losses in a boost converter in a number of different ways. FIG. 11(a) shows another embodiment of the present invention in a boost converter 1100, with a clamping capacitor coupled to the input, and FIG. 11(b) shows yet another embodiment of the present invention in a boost converter 1150, with a clamping capacitor connected to the ground reference. Both embodiments reduce reverse-recovery losses by controlling the rate of change of current $i_D$ (i.e. $di_D/dt$) in rectifier 308. To facilitate comparison of other boost converters of the present invention, functionally equivalent elements, e.g. the clamping capacitors, in boost converters 300, 920, 1000, 1100 and 1150 referenced here and above are provided the same reference numerals. In FIG. 11(a), boost converter 1100 returns the energy of inductor 301 to the input node 1101. As a result, in boost converter 1100, the current stress of the filter or output capacitor 309 is reduced, as compared to boost converter 300 of FIG. 3, because current $i_L$ of inductor 301 does not flow through output capacitor 309.

In boost converter 1150 of FIG. 11(b), auxiliary switch 302 must be implemented by a P-type MOSFET. Since this MOSFET in auxiliary switch 302 is referenced to ground voltage, non-isolated gate drives can be used for both switches. However, boost converter 1150 requires clamping capacitor 306 to have a substantially higher voltage rating than those of boost converters 300 and 1100 above, since the maximum voltage across clamping capacitor 306 is $V_o+V_c$ in boost converter 1150, rather than $V_c$ in boost converters 300 and 1100 of FIGS. 3 and 11(a).

Figure 12:
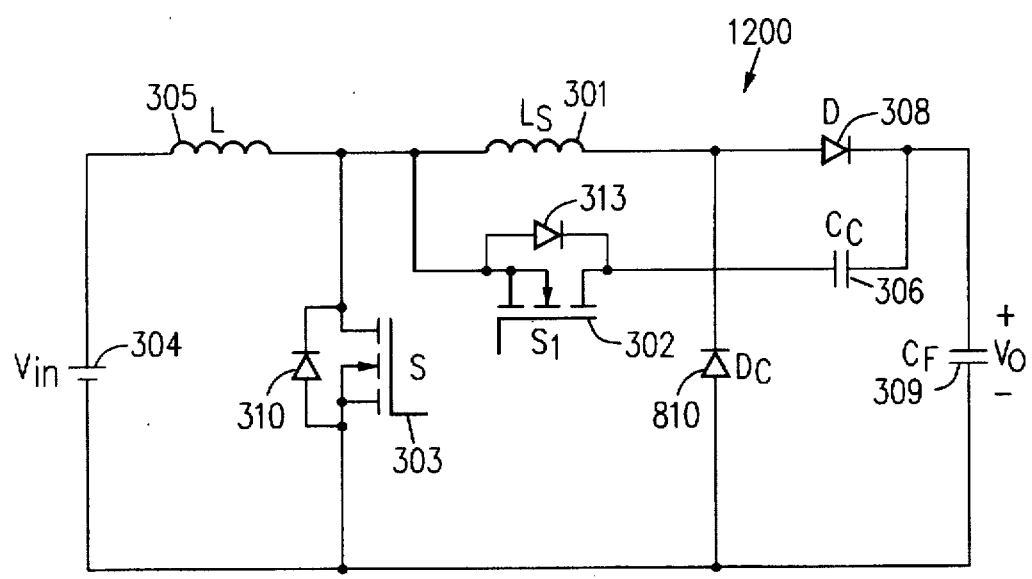
FIG. 12 shows yet another embodiment of the present invention in a boost converter 1200, with inductor 301 in the "rectifier branch", rather than the "switch branch."

FIG. 12 shows yet another embodiment of the present invention in a boost converter 1200, with inductor 301 in the "rectifier branch", rather than the "switch branch", i.e. current $i_L$ of inductor 301 being equal to current $i_D$ of rectifier 308, when rectifier 308 is forward conducting, rather than being equal to current $i_s$ of boost switch 303, when boost switch 303 is conducting. The operation of boost converter 1200 is substantially the same as that of circuit 300 described above in conjunction with FIGS. 4–6, except that current $i_L$ in inductor 301 is substantially the same as $i_D$ of rectifier 308, when rectifier 308 is conducting, rather than being equal to $i_s$ of boost switch 303, when boost switch 303 is conducting. Those skilled in the art, upon consideration of the above description, will also appreciate that boost converters equivalent to boost converter 1200 can be achieved by coupling clamping capacitor 306 to either the input node, or the ground reference, in the manner taught above in conjunction with FIGS. 11(a) and 11(b).

Figure 13A:
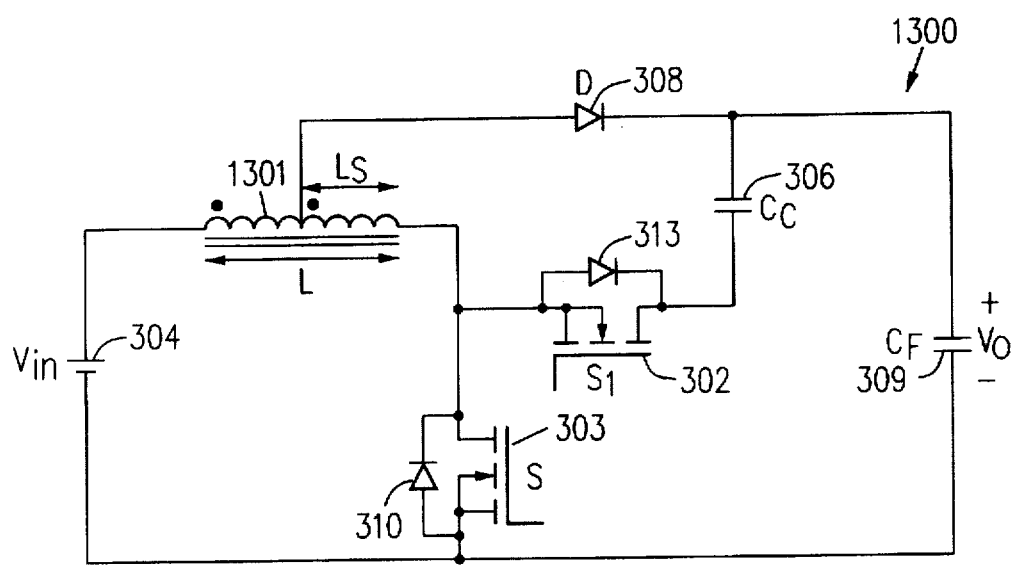
FIGS. 13(a) and 13(b) show respectively boost converters 1300 and 1350, which are implementations of boost converter 300 of FIG. 3 and boost converter 1200 of FIG. 12, using tapped inductors.
Figure 13B:
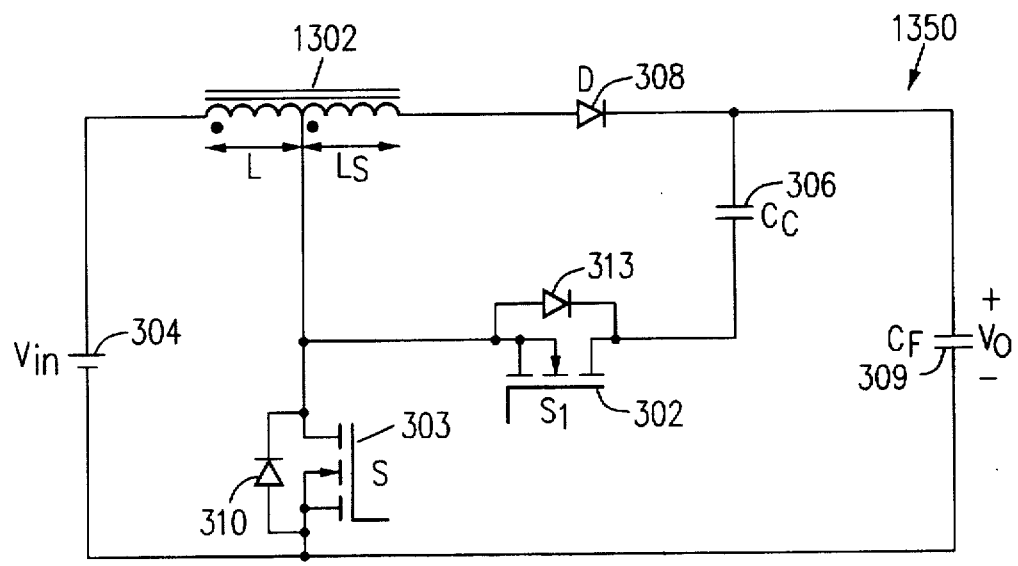

FIGS. 13(a) and 13(b) show respectively boost converters 1300 and 1350, which are implementations of boost converter 300 of FIG. 3 and boost converter 1200 of FIG. 12, using tapped inductors.

Figure 14A:
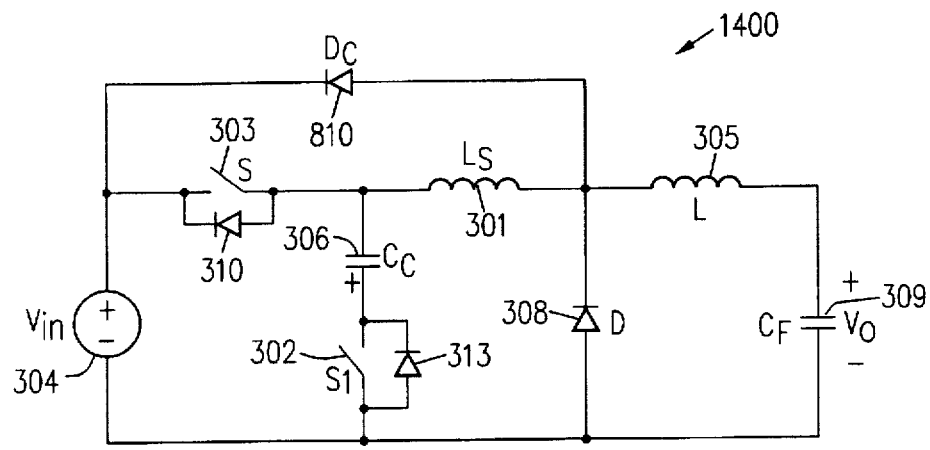
FIGS. 14(a)–14(c) show embodiments of the present invention in converters 1400, 1420 and 1425 of the non-isolated buck converter topology.
Figure 14B:
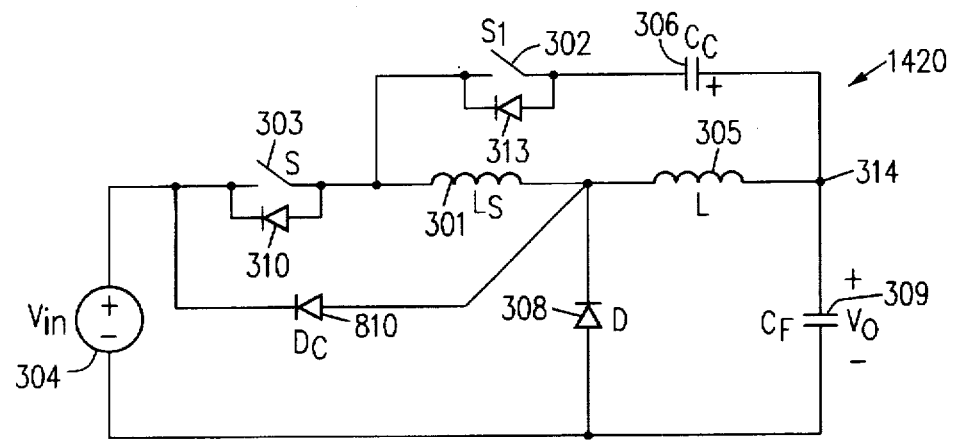
Figure 14C:
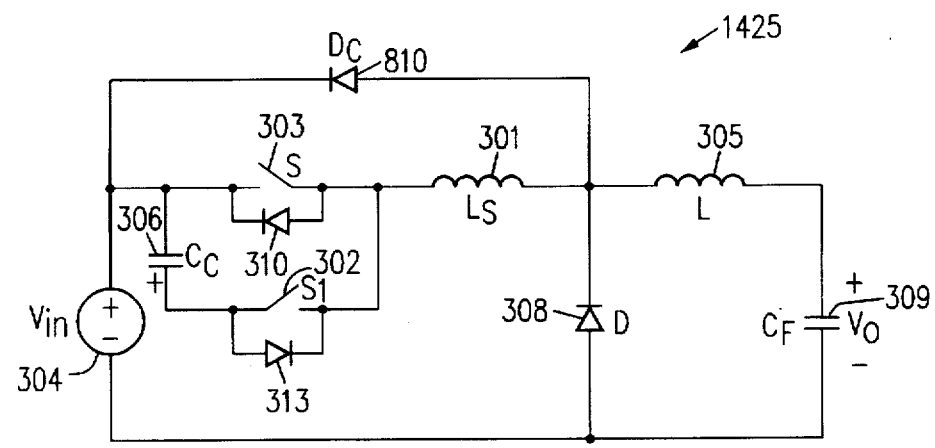

Finally, the present invention is applicable to any other non-isolated and isolated member of the PWM converter family. FIGS. 14(a)–14(c) show embodiments of the present invention in converters 1400, 1420 and 1425 of the non-isolated buck converter topology. In FIGS. 14(a)–14(c), inductor 301, clamping capacitor 306, clamping rectifier 810 and auxiliary switch 302 serve respectively substantially the same functions as the identically numbered inductor, capacitor, clamping rectifier and auxiliary switch discussed. FIGS. 14(a)–14(c) show clamping capacitor 306 coupled to ground reference, output node 314 and input voltage source 304 respectively.

Figure 14D:
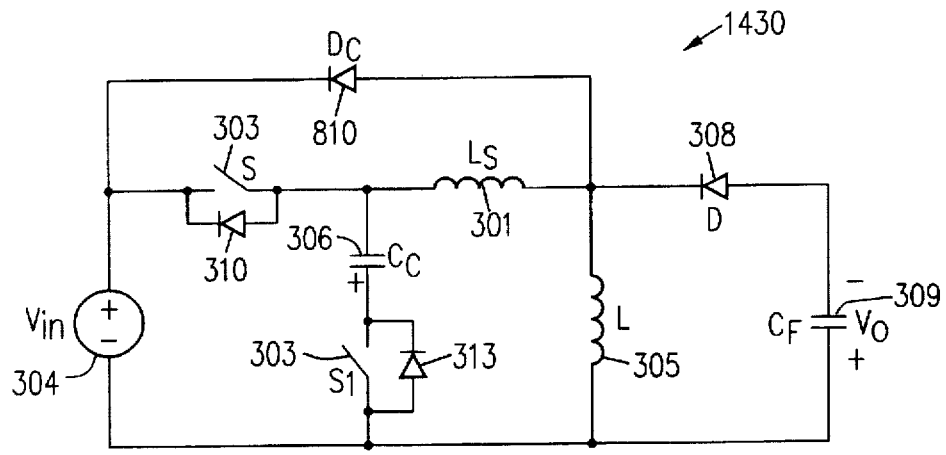
FIGS. 14(d)–14(f) show embodiments of the present invention in converters 1430, 1435 and 1440 of the non-isolated buck/boost converter topology.
Figure 14E:
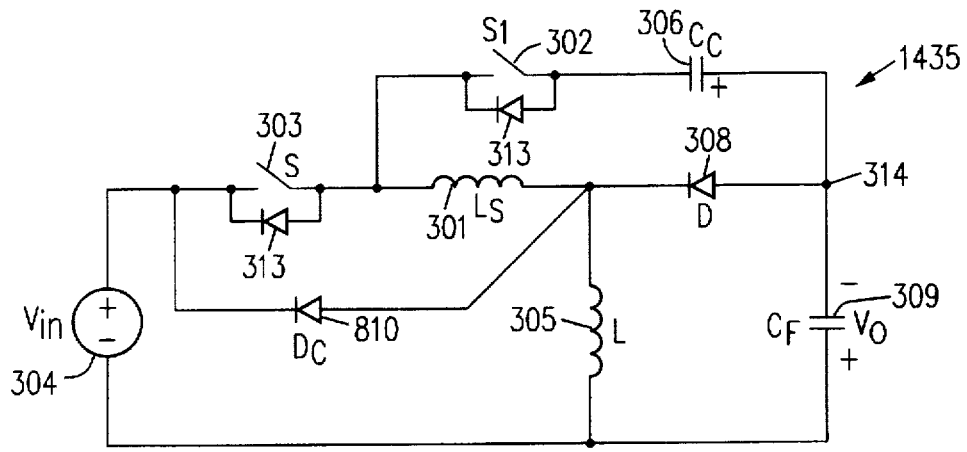
Figure 14F:
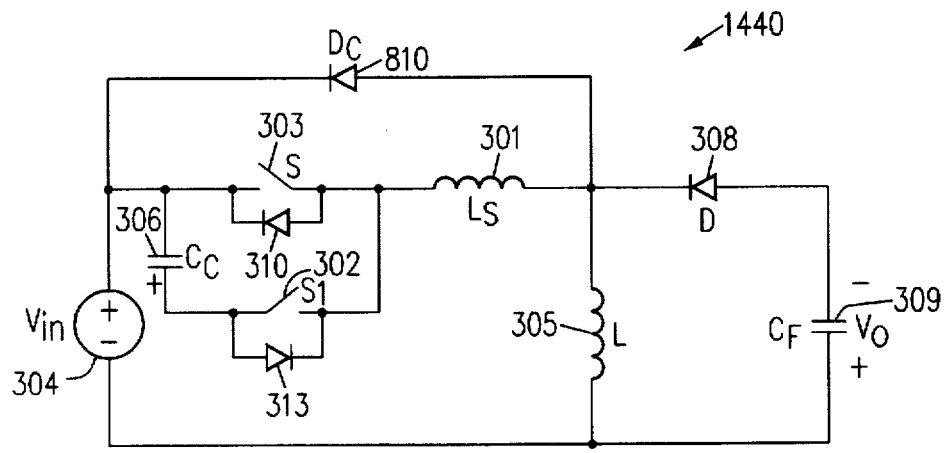
Figure 14G:
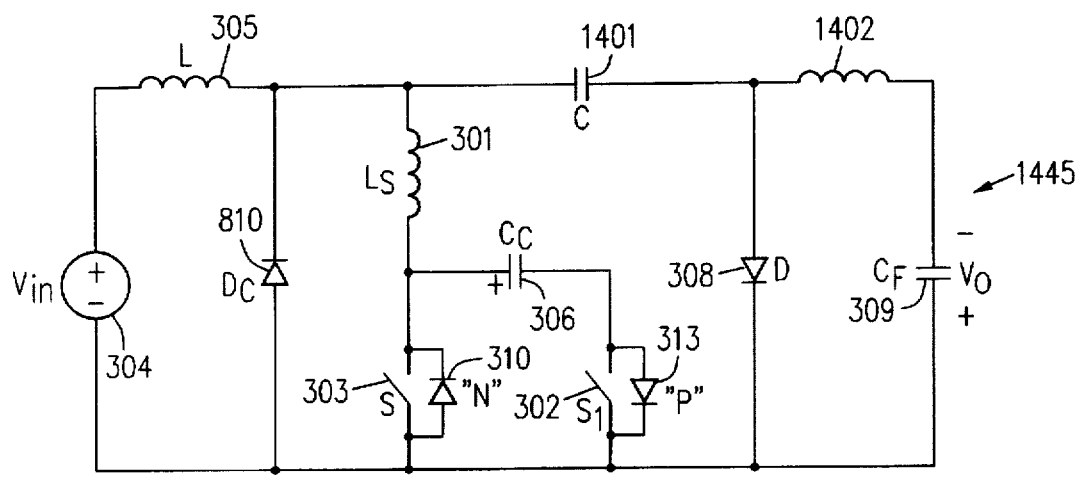
FIGS. 14(g)–14(i) show embodiments of the present invention in converters 1445, 1450 and 1455 of the non-isolated Cuk converter topology.
Figure 14H:
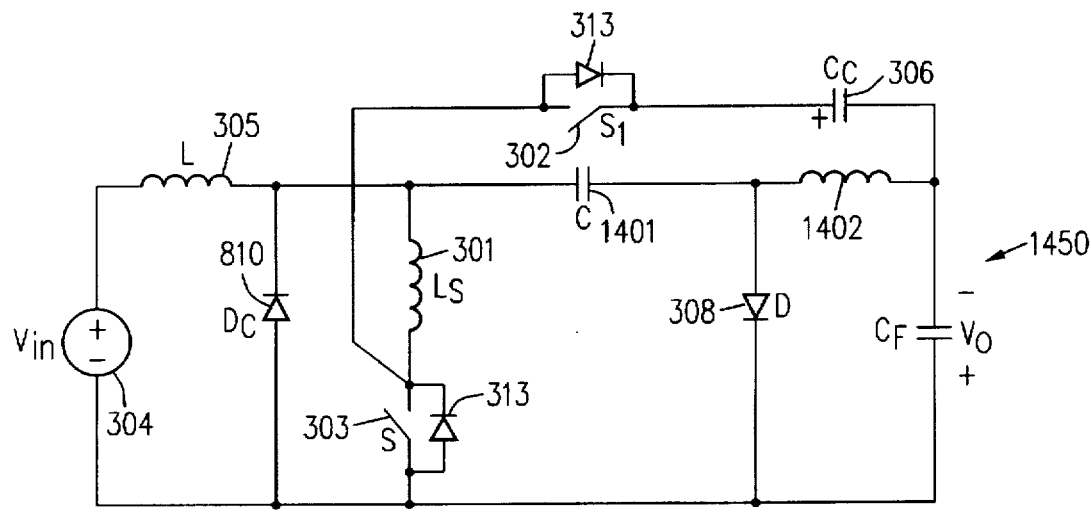
Figure 14I:
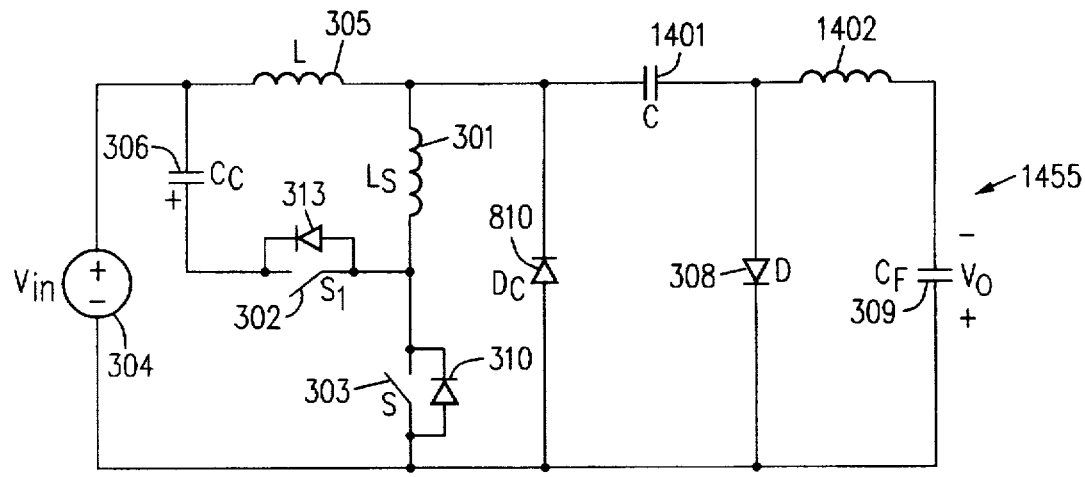
Figure 14J:
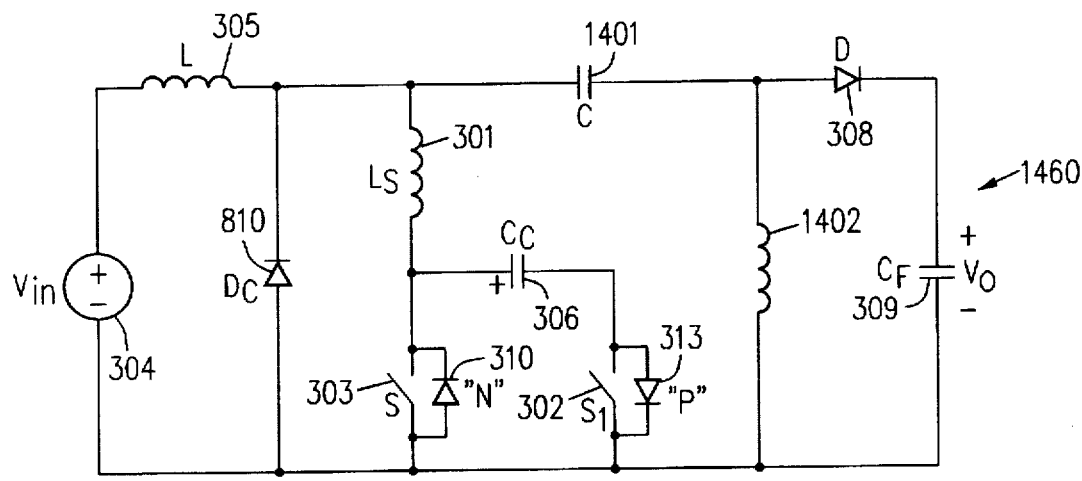
FIGS. 14(j)–14(l) show embodiments of the present invention in converters 1460, 1465 and 1470 of the non-isolated SEPIC converter topology.
Figure 14K:
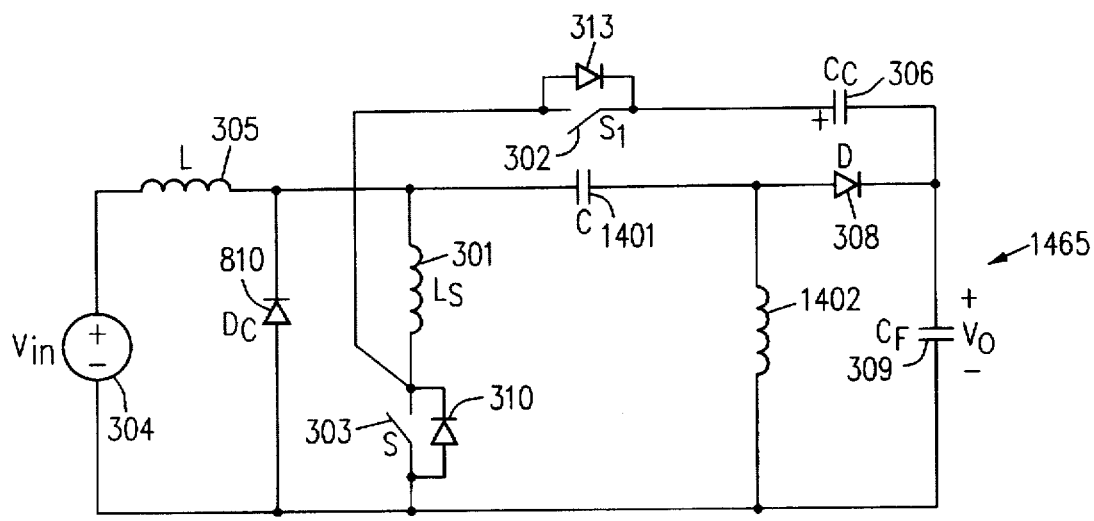
Figure 14L:
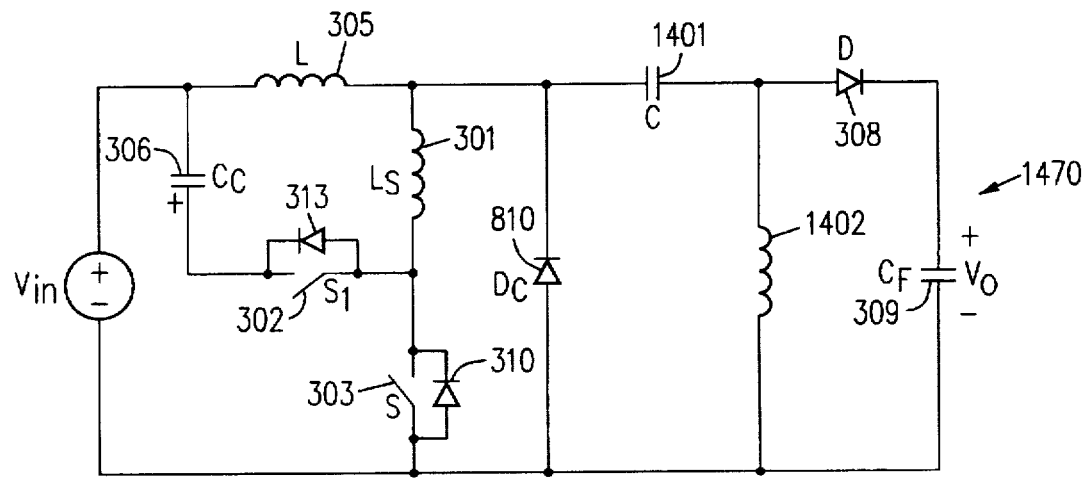
Figure 14M:
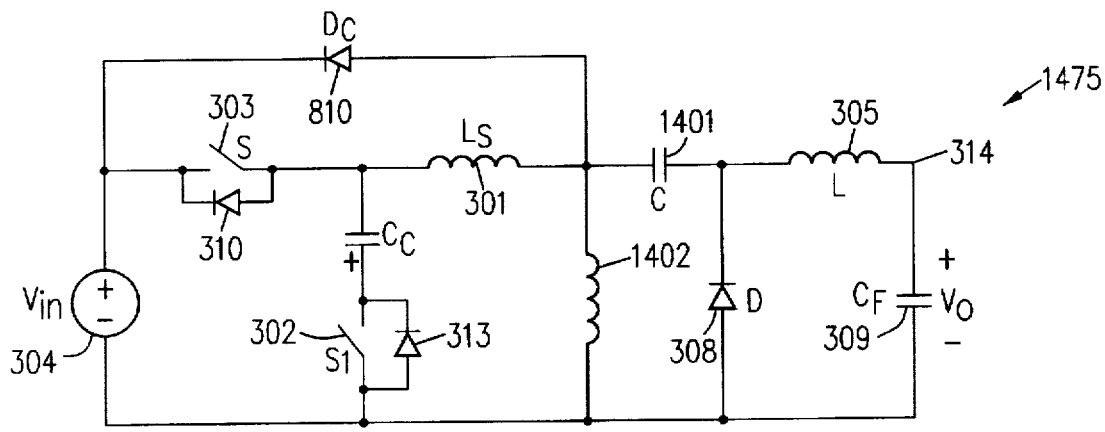
FIGS. 14(m)–14(o) show embodiments of the present invention in converters 1475, 1480 and 1485 of the non-isolated zeta converter topology.
Figure 14N:
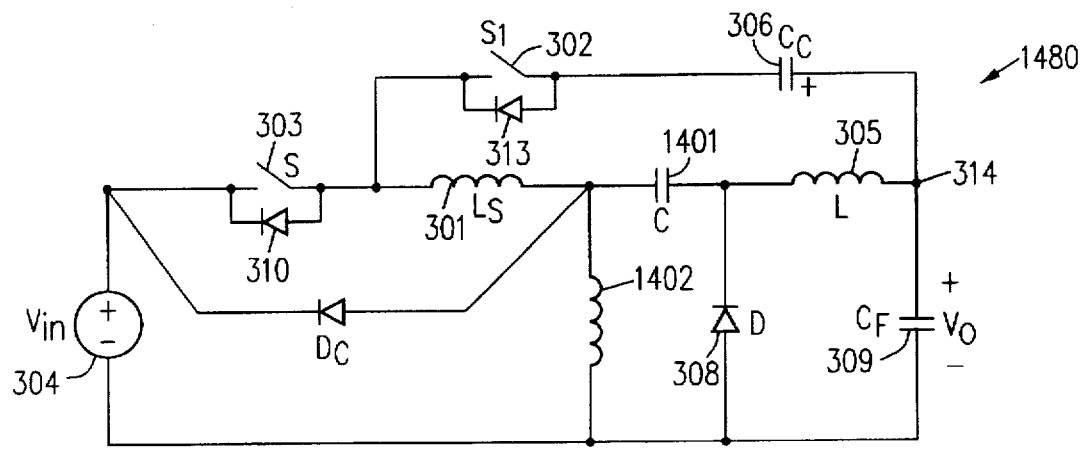
Figure 14O:
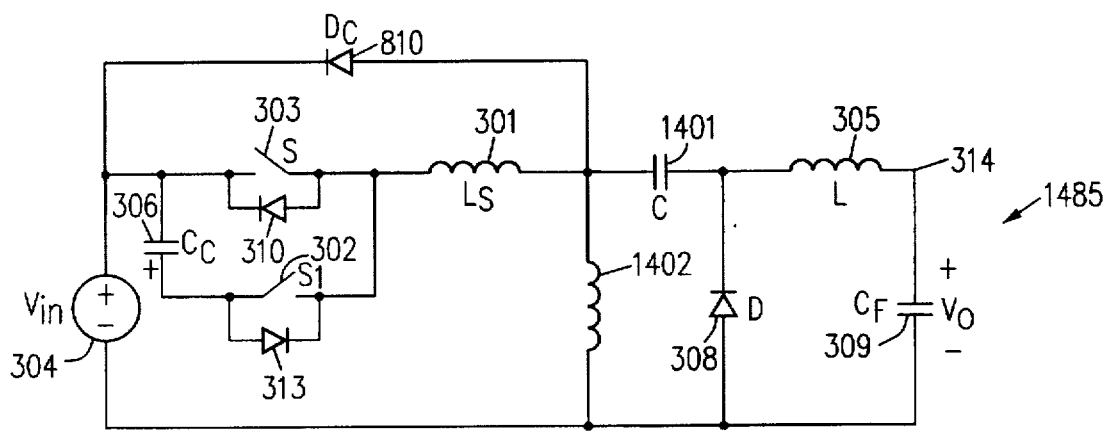

Similarly, FIGS. 14(d)–14(f) show embodiments of the present invention in converters 1430, 1435 and 1440 of the non-isolated buck/boost converter topology. FIGS. 14(d)–14(f) show clamping capacitor 306 coupled to ground reference, output node 314 and input voltage source 304 respectively. FIGS. 14(g)–14(i) show embodiments of the present invention in converters 1445, 1450 and 1455 of the non-isolated Cuk converter topology. FIGS. 14(g)–14(i) show clamping capacitor 306 coupled to ground reference, output node 314 and input voltage source 304 respectively. FIGS. 14(j)–14(l) show embodiments of the present invention in converters 1460, 1465 and 1470 of the non-isolated SEPIC converter topology. FIGS. 14(j)–14(l) show clamping capacitor 306 coupled to ground reference, output node 314 and input voltage source 304 respectively. FIGS. 14(m)–14(o) show embodiments of the present invention in converters 1475, 1480 and 1485 of the non-isolated zeta converter topology. FIGS. 14(m)–14(o) show clamping capacitor 306 coupled to ground reference, output node 314 and input voltage source 304 respectively. In FIGS. 14(m) through 14(o), although shown here as being coupled to input voltage source 304, clamping diode 810 can also be connected to output terminal 314. Upon consideration of the discussion above, those skilled in the art would appreciate that, although shown in FIGS. 14(a) through 14(o) as being implemented on the "switch branch", inductor 301 can also be implemented in the "rectifier branch", in the same manner as discussed above with respect to FIG. 12, regarding implementing inductor 301 on the "switch" and "rectifier" sides.

Figure 15A:
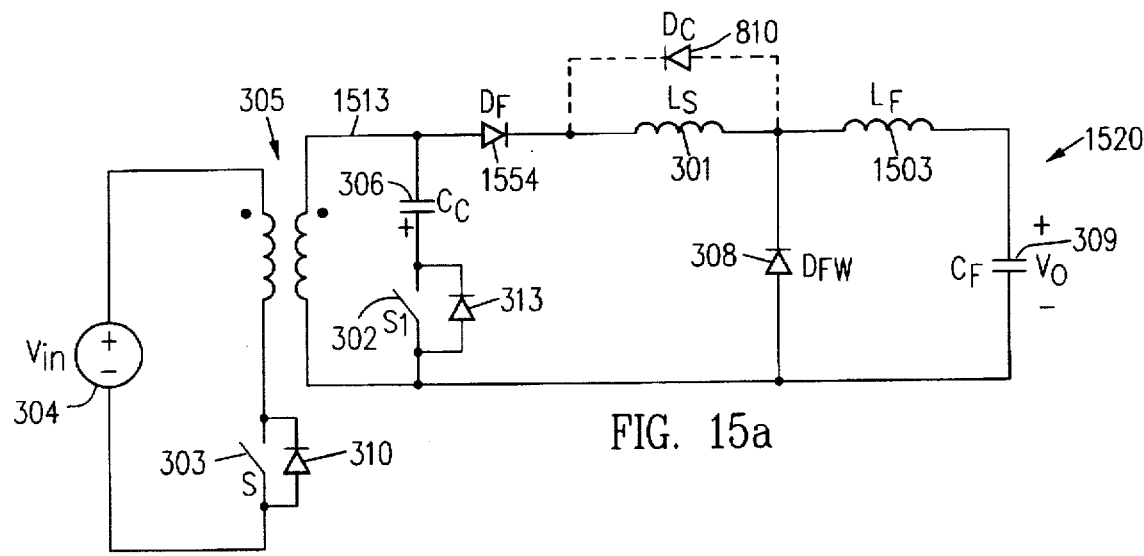
FIG. 15(a) through 15(c) show embodiments of the present invention in converters 1520, 1525 and 1530 of the isolated forward converter topology.
Figure 15B:
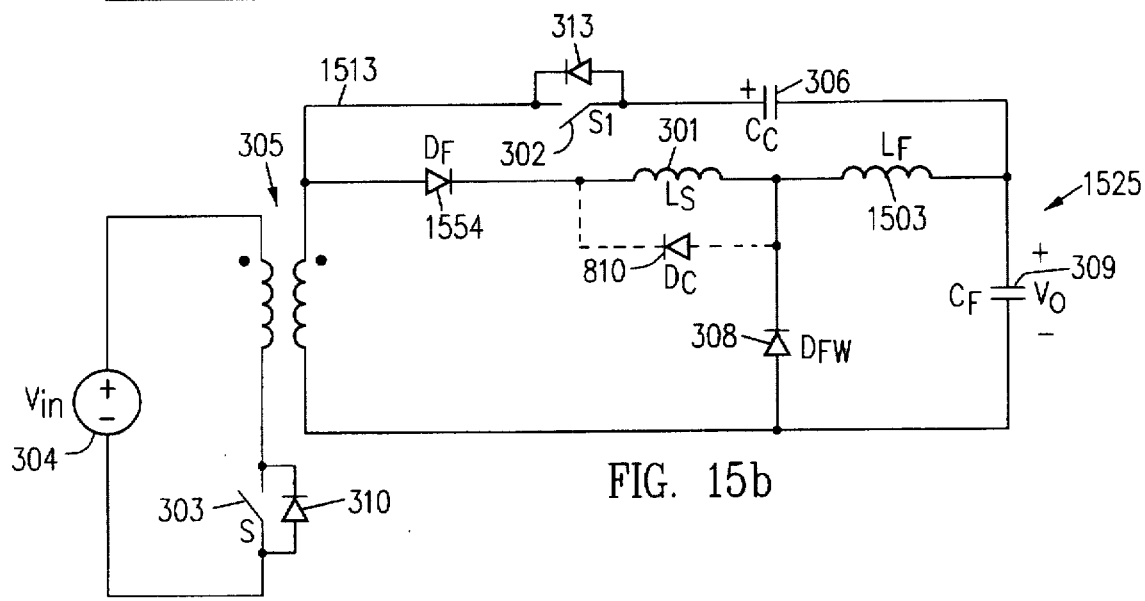
Figure 15C:
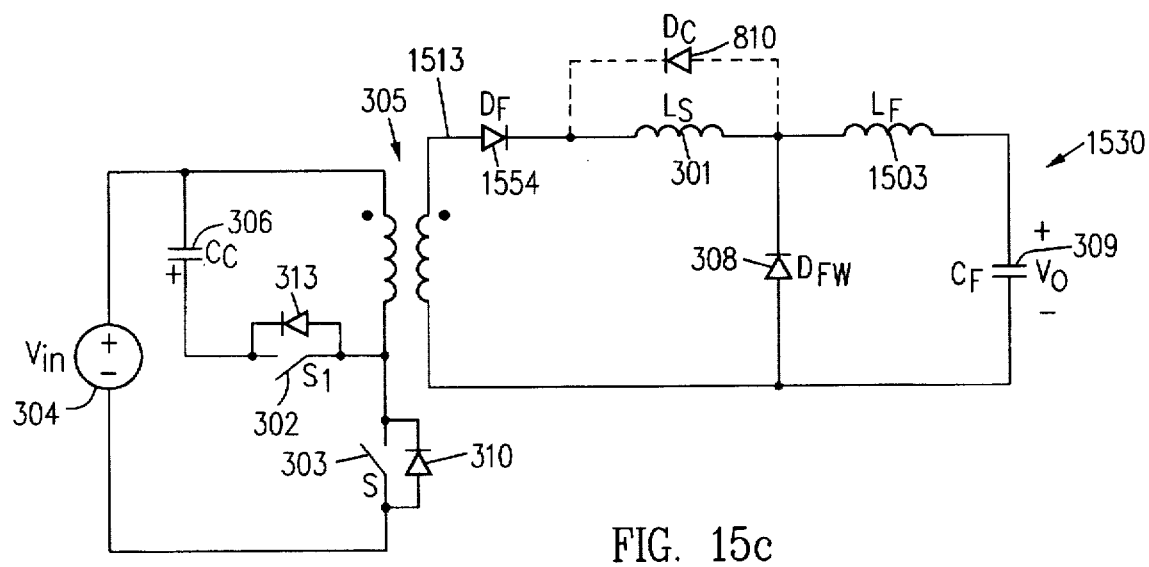
Figure 15D:
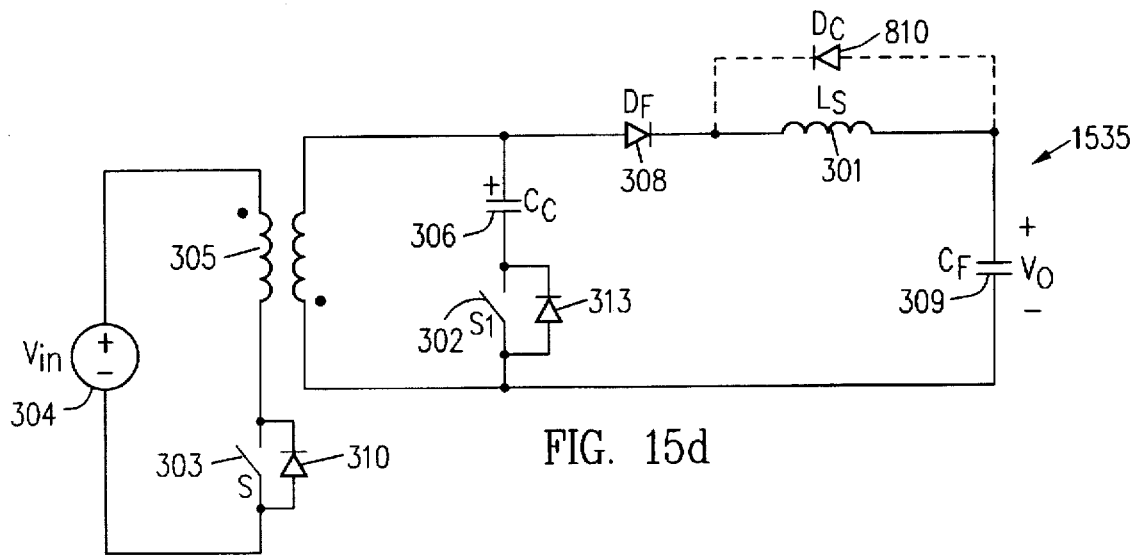
FIG. 15(d) through 15(f) show embodiments of the present invention in converters 1535, 1540 and 1545 of the isolated flyback converter topology.
Figure 15E:
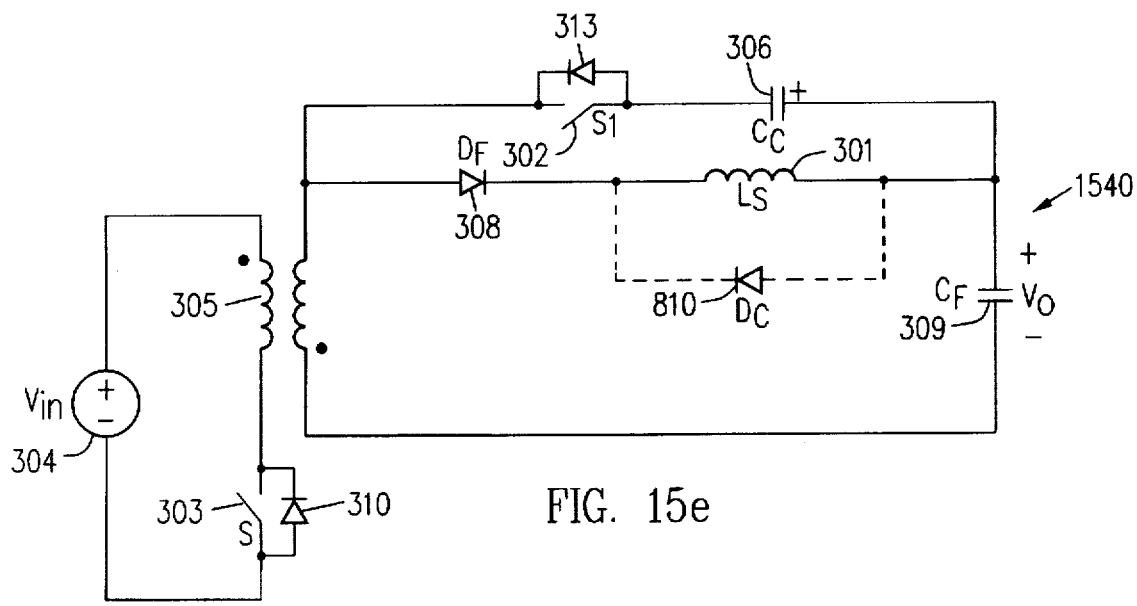
Figure 15F:
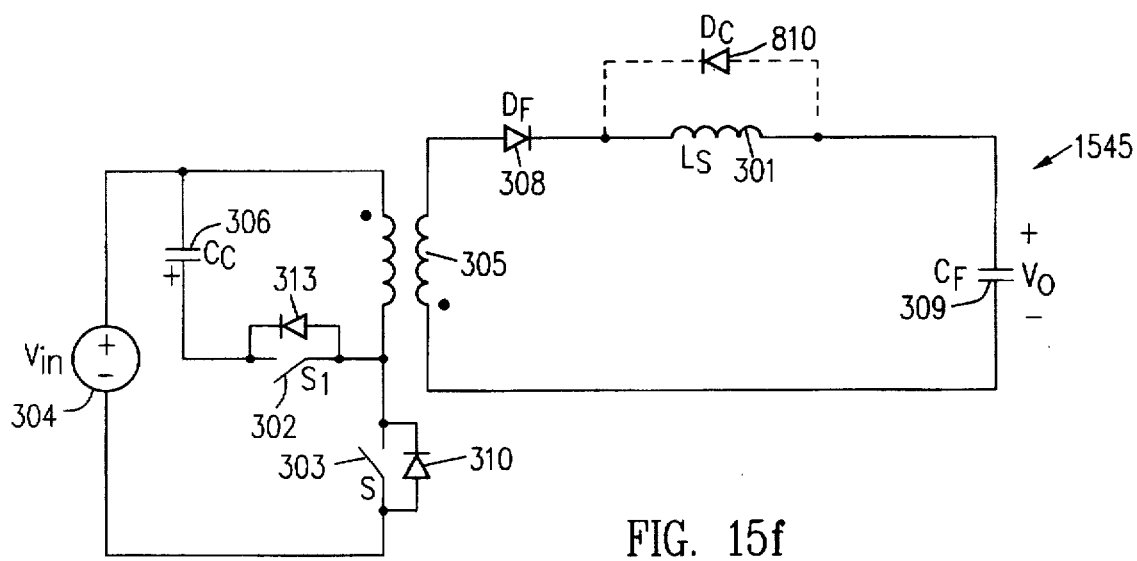
Figure 15G:
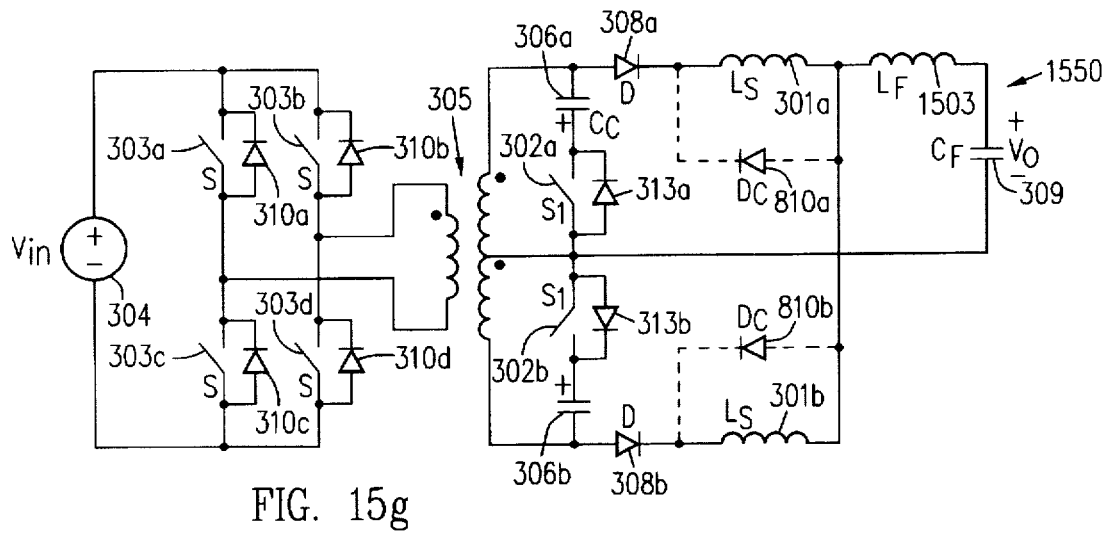
FIG. 15(g) through 15(i) show embodiments of the present invention in converters 1550, 1555 and 1560 of the isolated full bridge converter topology.
Figure 15H:
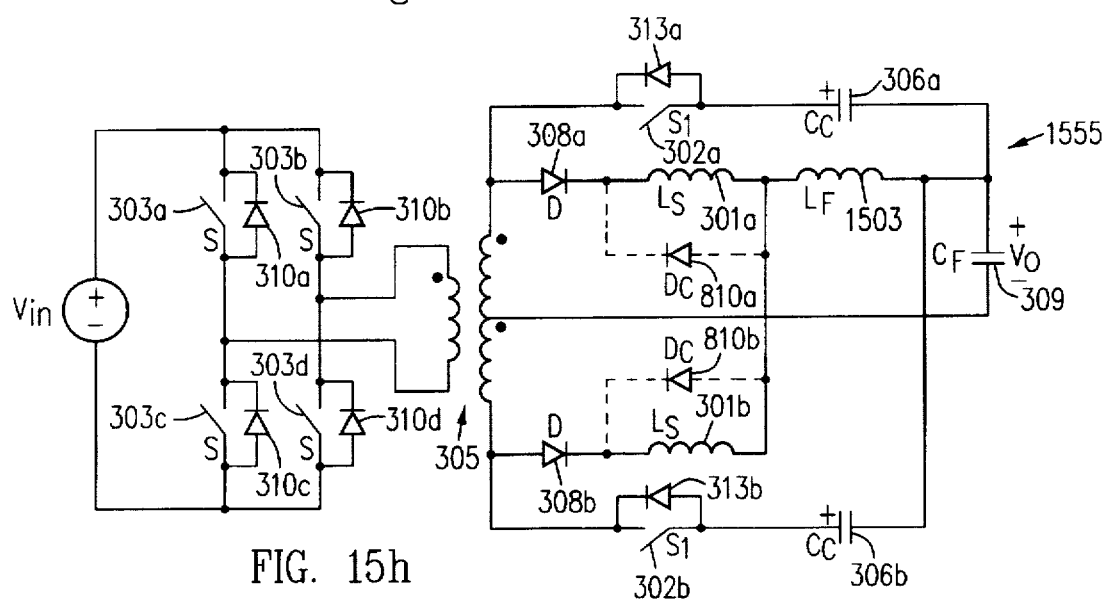
Figure 15I:
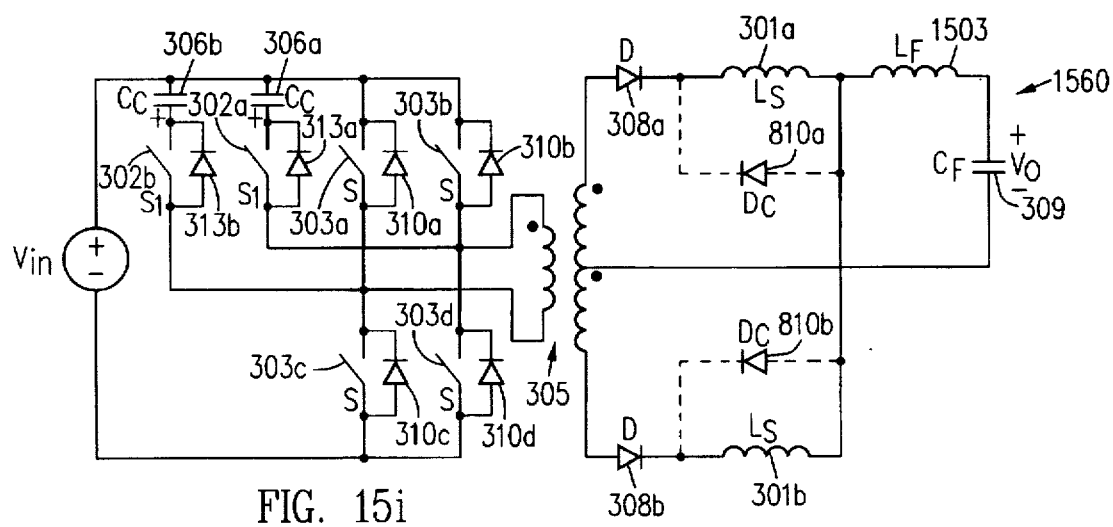
Figure 15J:
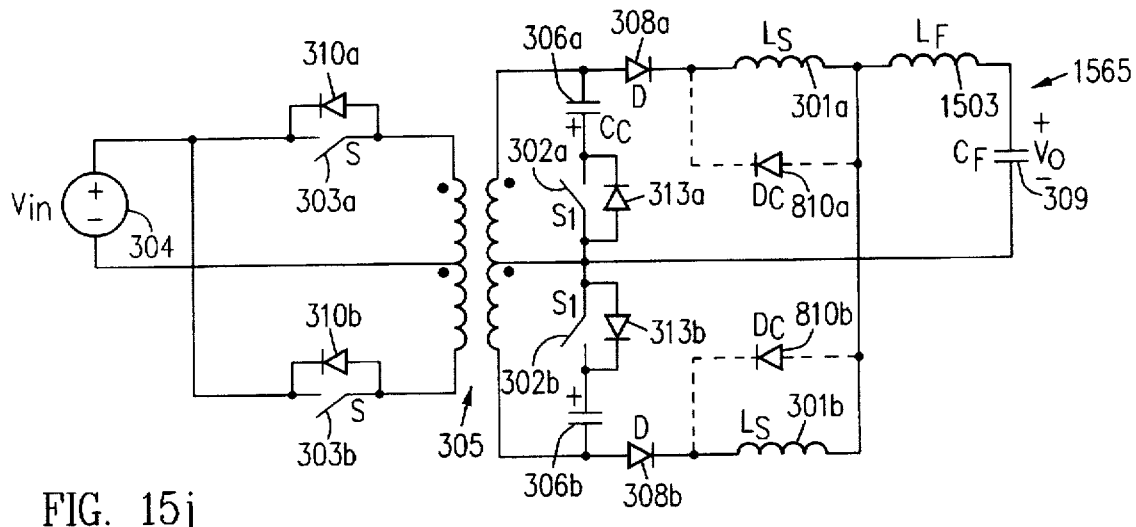
FIG. 15(j) through 15(l) show embodiments of the present invention in converters 1565, 1570 and 1575 of the isolated push-pull converter topology.
Figure 15K:
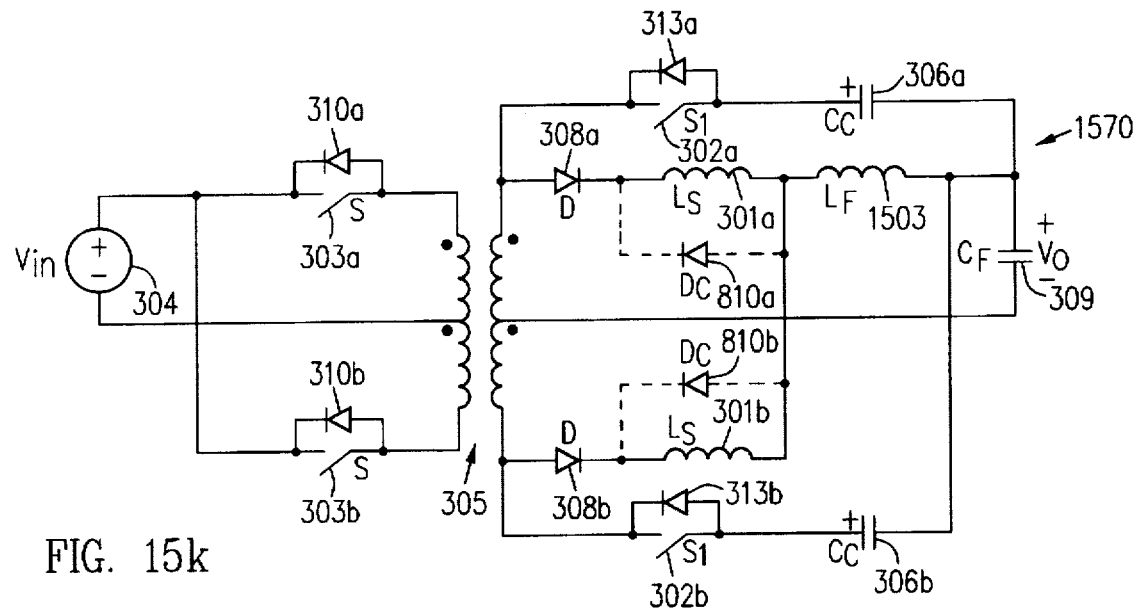
Figure 15L:
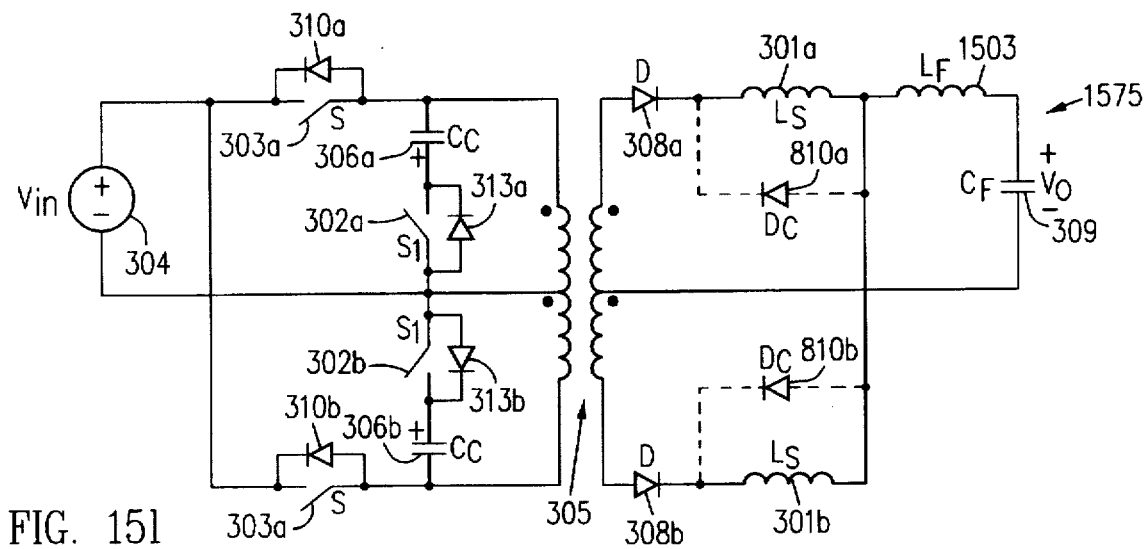

FIG. 15(a) through 15(c) show embodiments of the present invention in converters 1520, 1525 and 1530 of the isolated forward converter topology. FIGS. 15(a)–15(c) show clamping capacitor 306 coupled to ground reference, output node 314 and input voltage source 304 respectively. Similarly, FIG. 15(d) through 15(f) show embodiments of the present invention in converters 1535, 1540 and 1545 of the isolated flyback converter topology. FIGS. 15(d)–15(f) show clamping capacitor 306 coupled to ground reference, output node 314 and input voltage source 304 respectively. FIG. 15(g) through 15(i) show embodiments of the present invention in converters 1550, 1555 and 1560 of the isolated full bridge converter topology. FIGS. 15(g)–15(i) show clamping capacitor 306 coupled to ground reference, output node 314 and input voltage source 304 respectively. FIG. 15(j) through 15(l) show embodiments of the present invention in converters 1565, 1570 and 1575 of the isolated push-pull converter topology. FIGS. 15(j)–15(l) show clamping capacitor 306 coupled to ground reference, output node 314 and input voltage source 304 respectively. Upon consideration of the discussion above, those skilled in the art would appreciate that, although shown in FIGS. 15(a) through 14(l) as being implemented on the "secondary side" of the transformer 305, inductor 301 can also be implemented in the primary side of the transformer, in substantially the same manner discussed above with respect FIG. 12, regarding implementing inductor 301 on the "switch" and "rectifier" sides.

The above detailed description is provided to illustrate the specific embodiments of the present invention and is not intended to be limiting. Numerous modifications and variations within the present invention are possible. The present invention is defined by the following claims.

I claim:

1. A power converter for driving an output load, comprising:

an input voltage source;

an output filter capacitor coupled in parallel with said output load;

a first inductor provided for storing energy from said input voltage source;

a rectifier;

a primary switch controlled by a first control signal, said primary switch coupling said energy from said input voltage source to said first inductor, when said primary switch is closed; and an active snubber, including a second inductor, a clamping capacitor and an auxiliary switch controlled by a second control signal, wherein when said auxiliary switch is closed, said second inductor and said clamping capacitor are coupled in series, and wherein when said primary switch is closed, said second inductor controls a rate of change of current in said rectifier and, when said primary switch is open, energy in said second input is transferred through said clamping capacitor to a reference voltage source, said first and second control signals closing said primary and auxiliary switches at mutually exclusive time intervals.

2. A power converter as in claim 1, wherein said reference voltage source being said input voltage source.

3. A power converter as in claim 1, wherein said reference voltage source is the voltage across said output capacitor.

4. A power converter as in claim 1, wherein said reference voltage source is a ground reference voltage.

5. A power converter as in claim 1, further comprising a clamping diode for preventing resonance between a parasitic capacitor of said rectifier and said second inductor.

6. A power converter as in claim 1, wherein said converter is of a non-isolated type, said second inductor being connected in series with said primary switch, when said primary switch is closed.

7. A power converter as in claim 1, wherein said converter is of a non-isolated type, said second inductor being connected in series with said rectifier.

8. A power converter as in claim 1, wherein said first inductor comprises a transformer having a primary coil and a secondary coil, said second inductor being provided in series with said primary coil of said transformer.

9. A power converter as in claim 1, wherein said first inductor comprises a transformer having a primary coil and a secondary coil, said second inductor being provided in series with said secondary coil of said transformer.

10. A power converter as in claim 1, wherein said converter comprises a boost converter.

11. A power converter as in claim 10, wherein said boost converter comprises a rectifier coupled between said output filter capacitor and said first inductor, said second inductor being coupled in series with said first inductor and said primary switch when said switch is closed.

12. A power converter as in claim 10, wherein said boost converter comprises a rectifier coupled between said output filter capacitor, and a series connection of said second inductor and said first inductor.

13. A power converter as in claim 1, said active snubber further comprising a clamping diode for maintaining a minimum voltage across said clamping capacitor.

14. A power converter as in claim 1, further comprising a first diode and a second diode, said first and second diode being configured in an antiparallel fashion across said primary switch and said auxiliary switch respectively.

15. A power converter as in claim 14, further comprising:

a third diode connected in series with said auxiliary switch for blocking conduction of said second diode; and a fourth diode connected in parallel with said auxiliary switch and said third diode.

16. A power converter as in claim 1, wherein said first inductor and said second inductor being provided by a tapped inductor.

* * * * *

UNITED STATES PATENT AND TRADEMARK OFFICE
CERTIFICATE OF CORRECTION

PATENT NO. : 5,736,842
DATED : July 11, 1996
INVENTOR(S) : Jovanovic, Milan M.

It is certified that error appears in the above-identified patent and that said Letters Patent is hereby corrected as shown below:

Col. 2, line 11, delete "Snubbers" and substitute --Snubber--.
Col, 4, lines 4-5, delete the sentence beginning with "This increased...".
Col. 4, line 6, delete the sentence beginning with "Clearly, ... ".
Col. 4, lines 34-35, delete the words "connected in series with the first inductor and".
Col. 6, line 47, delete "306" and substitute therefor --308--.
Col. 6, lines 48-50, delete the sentence beginning "Further, when ..."
Col. 6, line 53, insert the word --be-- between "can" and "returned".
Col. 9, line 6, delete "$V_{in}$" and substitute --$V_o$--
Col. 9, line 36, insert after "306" the words --and voltage source 409--.
Col. 11, line 15, replace equation (4) by:

$$-- L_s \frac{di}{dt} = -(V_F + (R_{S(on)} + R_L)i_L) --.$$

Col. 11, line 32, delete "capacitance $C_c$ of clamping capacitor 306 is" and substitute -- values of circuit components are--.
Col. 11, lines 39-40, delete "the voltage $V_C$ across clamping capacitor 306" and substitute --the relationship between clamp voltage $V_C$, inductor current $i_L$, and clamp capacitor 306's capacitance $V_C$--.
Col. 11, lines 42-44, replace equation (5) by:

$$-- V_C = L_s \frac{2 I_{in}}{(1-D)T_s} = \frac{2 L_s f_s I_{in}}{1-D} --.$$

Col. 4, line 16, delete "206" and substitute therefor --208--.

UNITED STATES PATENT AND TRADEMARK OFFICE
CERTIFICATE OF CORRECTION

PATENT NO. : 5,736,842
DATED : July 11, 1996
INVENTOR(S) : Jovanovic, Milan M.

It is certified that error appears in the above-identified patent and that said Letters Patent is hereby corrected as shown below:

Col. 11, line 47, delete "inductance $L_S$ of inductor 301" and substitute -- capacitance $C_C$ of capacitor 306--.

Col. 11, lines 55-58, replace equation (7) by:

$$-- V_C = 2 L_x f_s I_o \left(\frac{V_o}{V_{in}}\right)^2 --$$

Col. 11, lines 59-64, delete the paragraph beginning "Thus, ..." and substitute:
-- According to equation (7), voltage $V_C$ is maximum at full load current $I_O$ and minimum input voltage $V_{in}$. For a given input voltage $V_{in}$, output current $I_O$, and output $V_O$, clamp capacitor voltage $V_C$ can be minimized by minimizing the product $L_s f_s$.--

Col. 12, line 56, replace "$T_2$" by --$T_3$--.
Col. 14, line 51, delete "14" and substitute --15--.

Signed and Sealed this

Tenth Day of November 1998

Attest:

BRUCE LEHMAN

*Attesting Officer*       *Commissioner of Patents and Trademarks*